US012648165B2

(12) United States Patent
Vais et al.

(10) Patent No.: US 12,648,165 B2
(45) Date of Patent: Jun. 2, 2026

(54) METHOD FOR PRODUCING A SEMICONDUCTOR CHIP

(71) Applicant: IMEC VZW, Leuven (BE)

(72) Inventors: Abhitosh Vais, Heverlee (BE);
Bertrand Paravais, Nil-Saint-Vincent
(BE); Guillaume Boccardi,
Sint-Lambrechts-Woluwe (BE);
Bernardette Kunert, Wilsele (BE);
Yves Mols, Wijnegem (BE); **Sachin
Yadav**, Leuven (BE)

(73) Assignee: Imec vzw, Leuven (BE)

( * ) Notice: Subject to any disclaimer, the term of this
patent is extended or adjusted under 35
U.S.C. 154(b) by 425 days.

(21) Appl. No.: 18/328,182

(22) Filed: Jun. 2, 2023

(65) Prior Publication Data

US 2023/0395561 A1 Dec. 7, 2023

(51) Int. Cl.
H01L 29/66 (2006.01)
H10D 10/80 (2025.01)
(Continued)

(52) U.S. Cl.
CPC ............. H10D 10/80 (2025.01); H10D 30/47
(2025.01); H10P 54/00 (2026.01);
(Continued)

(58) Field of Classification Search
CPC ............... H01L 24/80; H01L 21/76898; H01L
2224/80895; H01L 21/78;
(Continued)

(56) References Cited

U.S. PATENT DOCUMENTS

| | | | |
|---|---|---|---|
| 5,073,230 A | 12/1991 | Maracas et al. | |
| 7,309,620 B2 | 12/2007 | Fonash et al. | |

(Continued)

FOREIGN PATENT DOCUMENTS

| | | | | |
|---|---|---|---|---|
| CN | 110574163 A | * | 12/2019 | .......... H01L 23/481 |
| EP | 3288067 A1 | | 2/2018 | |

(Continued)

OTHER PUBLICATIONS

Extended European Search Report and Written Opinion, Application No. EP 22176944.1, mailed Dec. 8, 2022, 7 pages.

(Continued)

*Primary Examiner* — Niki H Nguyen
(74) *Attorney, Agent, or Firm* — McDonnell Boehnen
Hulbert & Berghoff LLP

(57) ABSTRACT

The present disclosure relates to at least one multilayer
structure that is produced on a semiconductor donor wafer,
by growing e.g. group III-V material in a cavity formed in
a dielectric support layer. A template layer embeds the
multilayer structure. The multilayer structure comprises a
release layer that is accessible from the sides. The method
further comprises the production of a device and the pro-
duction of conductive paths connected to the device and
terminating in a number of contact pads which are coplanar
with a first dielectric bonding surface. The donor wafer is
then bonded to a carrier wafer. TSV openings are then
produced from the back side of the carrier wafer and an
etchant is provided for selectively removing layers of the
multilayer structure. The etchant is supplied through the
TSV openings for the removal of the release layer. The
donor wafer is thereby released to form separate semicon-
ductor chips.

20 Claims, 20 Drawing Sheets

(51) Int. Cl.

| | |
|---|---|
| *H10D 30/47* | (2025.01) |
| *H10P 54/00* | (2026.01) |
| *H10W 20/00* | (2026.01) |
| *H10W 80/00* | (2026.01) |

(52) U.S. Cl.
CPC ........ *H10W 20/023* (2026.01); *H10W 80/312* (2026.01); *H10W 80/327* (2026.01)

(58) Field of Classification Search
CPC ....... H01L 2224/80896; H01L 25/0657; H01L 23/3114; H01L 2924/1305; H01L 2924/13051; H01L 21/2007; H01L 2224/08147; H01L 2224/12105; H01L 24/06; H01L 21/76251; H01L 2224/32145; H01L 2224/05008; H10D 30/47; H10D 10/80; H10D 30/475; H10D 84/85; H10D 62/151; H10D 10/021; H10D 10/821; H10D 62/824; H10D 84/83; H10D 62/137; H10D 84/856; H10D 30/4755; H10D 62/177; H10D 84/82; H10D 84/401; H10D 30/014; H10D 84/0193; H10D 64/62; H10D 10/40; H10D 30/60; H10D 10/051; H10D 62/133; H10D 62/134; H10D 89/601; H10D 64/602; H10D 30/477; H10D 84/0165; H10D 84/615; H10D 84/619; H10D 10/061; H10D 10/311; H10D 12/031; H10D 30/0291; H10D 62/235; H10D 62/393; H10D 84/83135; H10D 84/125; H10D 30/63
See application file for complete search history.

(56) References Cited

U.S. PATENT DOCUMENTS

| | | | | |
|---|---|---|---|---|
| 11,963,352 | B2 * | 4/2024 | Rabkin | .................. H01L 25/18 |
| 12,191,282 | B2 * | 1/2025 | Chuang | .............. H01L 25/0657 |
| 2011/0175211 | A1 * | 7/2011 | Cabral, Jr. | ............ H01L 23/556 |
| | | | | 257/776 |
| 2011/0233785 | A1 * | 9/2011 | Koester | ............ H01L 21/76898 |
| | | | | 257/E21.585 |
| 2012/0199930 | A1 * | 8/2012 | Hayashi | .............. H10F 39/8057 |
| | | | | 257/E31.127 |
| 2013/0252416 | A1 * | 9/2013 | Takeda | .................. H01L 23/481 |
| | | | | 438/630 |
| 2013/0270711 | A1 * | 10/2013 | Hebding | ............. H01L 25/0652 |
| | | | | 438/455 |
| 2019/0229080 | A1 * | 7/2019 | Leobandung | ....... H01L 25/0657 |
| 2019/0371891 | A1 * | 12/2019 | Goktepeli | ......... H01L 21/30625 |
| 2019/0393130 | A1 * | 12/2019 | Mahnkopf | ......... H01L 23/3677 |
| 2021/0184043 | A1 * | 6/2021 | Chia | .................... H10D 30/701 |
| 2021/0375723 | A1 | 12/2021 | Lin et al. | |
| 2021/0375781 | A1 * | 12/2021 | Lin | ...................... H01L 23/544 |
| 2021/0391302 | A1 * | 12/2021 | Kao | ................. H01L 21/76898 |

FOREIGN PATENT DOCUMENTS

| | | |
|---|---|---|
| EP | 3621101 A1 | 3/2020 |
| EP | 3789519 A1 | 3/2021 |
| WO | 201309833 A1 | 1/2013 |

OTHER PUBLICATIONS

Hussain, Aftab M. "Extending Moore's Law for Silicon CMOS Using More-Moore and More-than-Moore Technologies." PhD diss., 2016.

Hussain, Muhammad M., Jhonathan P. Rojas, and Galo A. Torres Sevilla. "Mechanically flexible optically transparent silicon fabric with high thermal budget devices from bulk silicon (100)." In Micro-and Nanotechnology Sensors, Systems, and Applications V, vol. 8725, pp. 352-365. SPIE, 2013.

Nour, Maha, Mohamed Ghoneim, Ravi Droopad, and Muhammad M. Hussain. "CMOS compatible route for GaAs based large scale flexible and transparent electronics." In 14th IEEE International Conference on Nanotechnology, pp. 835-838. IEEE, 2014.

Kunert, Bernardette, Robert Langer, Marianna Pantouvaki, Joris Van Campenhout, and Dries Van Thourhout. "Gaining an edge with nano-ridges." Compound Semiconductor 24, No. 5 (2018): 36-41.

* cited by examiner

METHOD FOR PRODUCING A SEMICONDUCTOR CHIP

CROSS-REFERENCE TO RELATED APPLICATIONS

The present application is a non-provisional patent application claiming priority to European Patent Application No. EP 22176944.1, filed Jun. 2, 2022, the contents of which are hereby incorporated by reference.

FIELD OF THE DISCLOSURE

The present disclosure is related to semiconductor processing, in particular to the co-integration of technologies based on different semiconductor materials. The primary focus is on the integration of III-V devices and Si-based technologies such as Si-CMOS or Si photonics. The disclosure is not limited to this particular combination of materials.

BACKGROUND

Semiconductor devices based on group III-V compound semiconducting materials such as GaAs, InGaAs or InP are extensively used in radio-frequency (RF) and optical technologies, for example in front-end modules for mobile communications, image sensors, and optical communication applications. Known devices of this type include heterojunction bipolar transistors (HBTs), high electron mobility transistors (HEMTs), Schottky diodes, lasers, PIN diodes etc.

Today, these devices are mainly fabricated on expensive native substrates (GaAs, InP, GaSb, etc.). However, future cellular communications (5G and beyond) and Optical I/O platforms will require much better performance from these devices in several areas including a lower cost, a higher flexibility in circuit design, and a reduced power consumption.

Due to the large mismatch in lattice constant and thermal expansion coefficient between III-V materials and crystalline Si, epitaxial growth of III-V on crystalline Si substrates leads to the formation of crystal defects e.g. misfit and threading dislocations. Above a given defect concentration, these defects lead to unwanted leakage currents and carrier mobility and lifetime degradation.

Therefore, the presence of such defects is detrimental to the device performance of both field-effect (e.g. HEMT) and bipolar (HBT, diodes, lasers) III-V devices and represents a major challenge in large-scale co-integration of III-V devices and Si-based technologies.

One way of obtaining essentially defect-free III-V layers on silicon is a technology called nano-ridge engineering (NRE), described in detail in patent publication document EP3789519A1. The technique involves the growing of III-V material in narrow nano-sized grooves of a substrate having silicon at the bottom of the grooves. The material grows into nano-ridges which protrude out of the grooves. Defects are trapped in the grooves by aspect ratio trapping (ART), and the upper layers of the nano-ridges are essentially defect-free. As described for example in the document "Gaining an edge with nano-ridges", Kunert et al, www.compoundsemiconductor.net, July 2018, the shape of the nano-ridges can be controlled by adjusting the growth conditions.

Patent publication document EP3288067A1 discloses a method wherein III-V nano-ridges are grown on a donor wafer, after which an upper portion of the nano-ridges is transferred to a handling wafer. The nano-ridges comprise a release layer that is removed after the transfer, leaving one or more III-V layers on the handling wafer, to be further processed thereon. The donor wafer can be re-used for subsequent transfer processes.

Patent publication document EP3621101A1 discloses a method for producing a III-V heterojunction bipolar transistor (HBT) or a III-V high electron mobility transistor (HEMT) on a single nano-ridge and integrating such devices with Si CMOS technology on the same substrate.

Such integration is however challenging due to the thermal budget mismatch between the two technologies.

SUMMARY

The present disclosure provides a solution to the problems highlighted above. In an example embodiment at least one multilayer structure is produced on a semiconductor donor wafer. A first semiconductor layer is grown on the bottom surface of a cavity formed in a support layer provided on the donor wafer, followed by consecutively grown additional layers, and wherein one or more of the upper layers of the structure are essentially defect-free. In the present context and in the appended claims, the term 'essentially defect free' refers to defect levels that are sufficiently low so that the defects are essentially not causing any defect-related detrimental issues of semiconductor devices, such as unwanted leakage currents and carrier mobility and lifetime degradation. A template layer is formed that is directly adjacent the multilayer structure, and that is formed as a stack of two dielectric sublayers, the bottom sublayer being selectively removable with respect to the top sublayer. One of the layers of the multilayer structure is a release layer that is accessible from the sides when the bottom sublayer of the template is removed selectively.

The method further comprises the production of a semiconductor device, for example an HBT and/or a HEMT or a photonic device such as a laser, from one or more of the upper layers of the multilayer structure or of several multilayer structures, and the production of conductive paths connected to the device and terminating one or more contact pads which are coplanar with a first dielectric bonding surface. The donor wafer is then bonded to a carrier wafer by bonding the first bonding surface to a bonding surface of the carrier wafer, the latter comprising active devices and conductive paths coupled to corresponding contact pads which are bonded during the bonding step to the contact pads produced on the donor wafer. Through semiconductor via (TSV) openings are then produced from the back side of the carrier wafer and an etchant is provided for removing the first sublayer of the template layer and the release layer of the multilayer structure. The etchant is supplied through the TSV openings for the removal of the first sublayer and/or for the removal of the release layer.

The donor wafer is thereby released and the carrier wafer is further processed and singulated to form separate semiconductor chips. The method enables the co-integration of silicon-based technologies such as Si-CMOS or Si-photonics with group III-V and/or group IV-based devices without requiring the production of Si and III-V and/or IV devices on the same substrate.

According to an embodiment, the multilayer structure is a nano-ridge structure and the cavity is a narrow trench formed in the support layer with the material of the donor wafer exposed at the bottom of the trench. Often multiple parallel trenches are formed for producing multiple parallel nano-ridge structures. This embodiment enables the growth of essentially defect-free III-V materials on a Si donor wafer, taking advantage of aspect ratio trapping in the narrow trenches. According to a particular embodiment, a HBT is formed from several parallel nano-ridge structures.

According to another embodiment, the multilayer structure is grown by selective area growth (SAG) on a donor wafer formed of material that is essentially matching the grown material in terms of the lattice constant and the thermal expansion coefficient. This embodiment enables for example the growth of a GaAs-based multilayer-structure on a germanium donor wafer. The material is again grown in a cavity delimited by a support layer, but the width of the cavity can be higher given that no aspect ratio trapping is required.

The present disclosure relates to a method for producing a semiconductor chip comprising the steps of:

providing a first semiconductor substrate comprising a support layer on its surface, the support layer comprising at least one cavity that is open to the surface of the support layer, with the semiconductor material of the substrate exposed on the bottom of the cavity, producing a multilayer structure on the substrate and extending outward from the surface of the support layer, by growing consecutive layers in the cavity and subsequently out of the cavity, the structure comprising:

at least one first semiconductor layer grown upwards from the bottom of the cavity, a release layer, on the at least one first layer, one or more additional semiconductor layers on the release layer, wherein at least the layers above the release layer are essentially defect-free layers, producing a dielectric template layer on the support layer, wherein:

the template layer comprises a first sublayer directly on the support layer, the first sublayer being formed of a first dielectric material, and a second sublayer directly on the first sublayer, and formed of a second dielectric material different from the first material, the first sublayer and the second sublayer are formed before or after producing the multilayer structure, the template layer is directly adjacent and in contact with the multilayer structure, leaving the top layer of the structure exposed, the first dielectric material is etchable selectively with respect to the second dielectric material, the multilayer structure and the support layer, at least one of the bottom and top surface of the release layer is positioned between the bottom and top surface of the first sublayer of the template layer, after the formation of the multilayer structure and the template layer, producing at least one semiconductor device from one or more of the semiconductor layers positioned above the release layer, after producing the at least one device, producing electrically conductive paths and a plurality of first contact pads, so that the conductive paths couple the device to the contact pads, the contact pads being part of a planar hybrid bonding surface formed of the first contact pads and of a first dielectric bonding layer produced on the second sublayer of the template layer, providing a second semiconductor substrate, comprising a front end of line portion comprising further semiconductor devices, and a back end of line portion, the back end of line portion comprising a plurality of second contact pads, the second contact pads being part of a second planar hybrid bonding surface formed of the second contact pads and of a second dielectric bonding layer that is part of the back end of line portion, performing hybrid bonding of the first substrate to the second substrate by mutually bonding the first and second bonding surfaces, so that the first contact pads are bonded and electrically connected to the second contact pads, thereby forming a bonded wafer assembly, after the hybrid bonding process, producing a plurality of through semiconductor via (TSV) openings through the second semiconductor substrate, starting from the back of the second substrate and traversing the full thickness of the second sublayer of the template layer, after producing the TSV openings, removing the first sublayer of the template layer selectively with respect to the second sublayer and with respect to the support layer and the multilayer structure, by supplying an etchant that removes the first sublayer selectively with respect to the multilayer structure and with respect to the second sublayer, after removing the first sublayer, removing the release layer by supplying an etchant that removes the release layer selectively with respect to the other layers of the multilayer structure and with respect to the second sublayer and the support layer, thereby releasing the second substrate and the device from the first substrate, leaving a backside of the device exposed, wherein at least one of the etchants, i.e. the etchant for removing the first sublayer or the etchant for removing the release layer is supplied through the TSV openings, after releasing the second substrate, filling the TSV openings with an electrically conductive material, singulating the second substrate to thereby obtain a semiconductor chip comprising the device formed of layers of the multilayer structure, integrated with the devices in the front end of line portion.

According to an embodiment, the cavity is a trench and the multilayer structure is a nano-ridge structure obtained by growing a first layer in the trench, the width of the trench being suitable for applying aspect ratio trapping.

According to an embodiment, the donor substrate is a silicon or a germanium substrate and the nano-ridge structure is formed of layers of group III-V semiconductor material.

According to an embodiment, the first layer grown directly on the bottom of the cavity is essentially matching the substrate in terms of the respective lattice constants and thermal expansion coefficients of the first layer and of the first substrate.

According to an embodiment, the donor substrate is a germanium substrate, and the multilayer structure is formed of layers of group III-V semiconductor material, or the multilayer structure comprises a Ge layer directly on the Ge substrate, a group III-V release layer and one or more group IV semiconductor layers on the release layer.

According to an embodiment, at least the first layer of the template layer is produced prior to growing the multilayer structure, and patterned so as to form sidewalls aligned to at least two opposite edges of the cavity so that the growth of the multilayer structure outside of the cavity is laterally contained by the sidewalls.

According to an embodiment, the template layer is produced after the formation of the multilayer structure, by producing the first sublayer on the support layer after the structure has been produced, and by producing the second sublayer on the first sublayer.

According to an embodiment, the semiconductor device is a heterojunction bipolar transistor (HBT) formed on at least one multilayer structure, and comprising a collector layer, a base layer and an emitter layer.

According to an embodiment, an HBT is formed on an array of directly adjacent and parallel multilayer structures comprising the same layer sequence, wherein the method comprises the steps of:

exposing a portion of the base layers of the array of multilayer structures, by removing portions of the layers present on top of the base layers, epitaxially growing the material of the base layers on the exposed portions of the base layers, until the material merges in the areas between the nano-ridge structures, thereby forming base contact portions at least in between the nano-ridge structures, producing conductive paths which are electrically connected to the base contact portions and to contact pads which are coplanar with the first bonding surface, for each structure of the array of multilayer structures, producing a conductive path that is electrically connected to the remaining portion of the layers present on top of the base layer and to a contact pad that is coplanar with the first bonding surface, bonding the contact pads to respective contact pads which are coplanar with the second bonding surface, According to an embodiment, the semiconductor device is a high electron mobility transistor (HEMT) formed on one multilayer structure and comprising a channel layer and at least one barrier layer.

According to an embodiment, the method further comprises, after releasing and before singulating the second substrate, the step of producing electrical connections to one or more layers of the released device, possibly after thinning and/or patterning the one or more layers.

The present disclosure is equally related to a semiconductor chip comprising:

a carrier substrate, a front end of line portion above the carrier substrate, a back end of line portion above the FEOL portion and comprising a top layer comprising first contact pads, second contact pads bonded and thereby electrically connected to the first contact pads, conductive paths connected to the second contact pads, a semiconductor device located above the back end of line portion and coupled to the conductive paths.

According to an embodiment of a chip according to the present disclosure, the semiconductor device is a group III-V device or a group IV device and wherein the carrier substrate is a silicon substrate.

According to an embodiment of a chip according to the present disclosure, the semiconductor device is a HBT or a HEMT. A chip according to the present disclosure may comprise multiple of the devices, including at least one HBT and at least one HEMT.

BRIEF DESCRIPTION OF THE DRAWINGS

The drawings illustrate steps according to various embodiments. The drawings are not intended as representations of realistic semiconductor structures. Some details known to the skilled reader and not relevant as characteristic features of the present disclosure may be omitted and/or drawn on a scale that is not in correspondence to real structures.

6

Figure 1A:
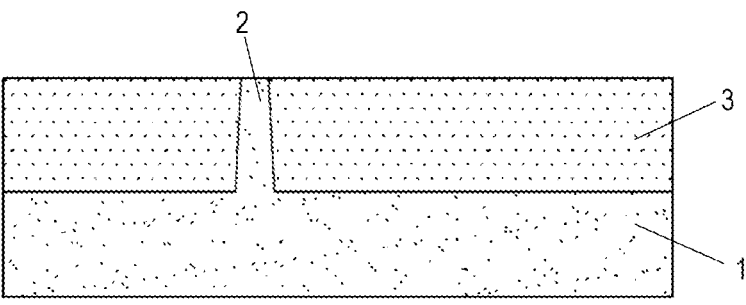
Figure 1B:
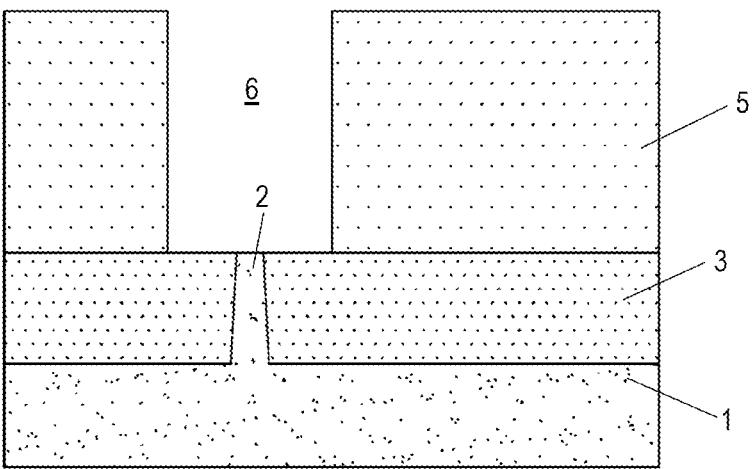
Figure 1C:
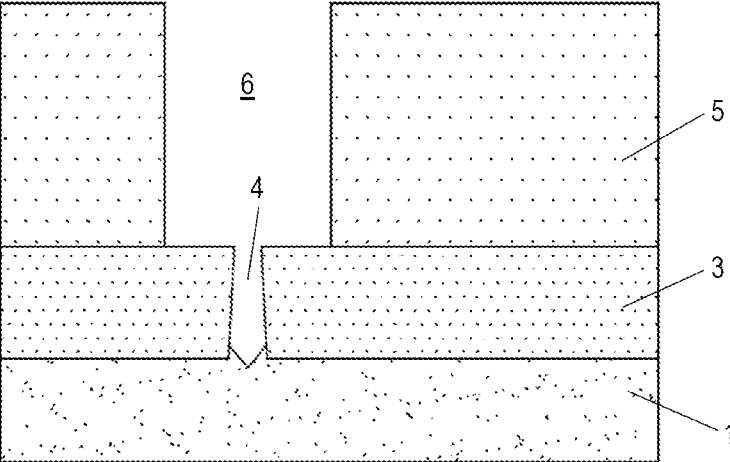
Figure 1D:
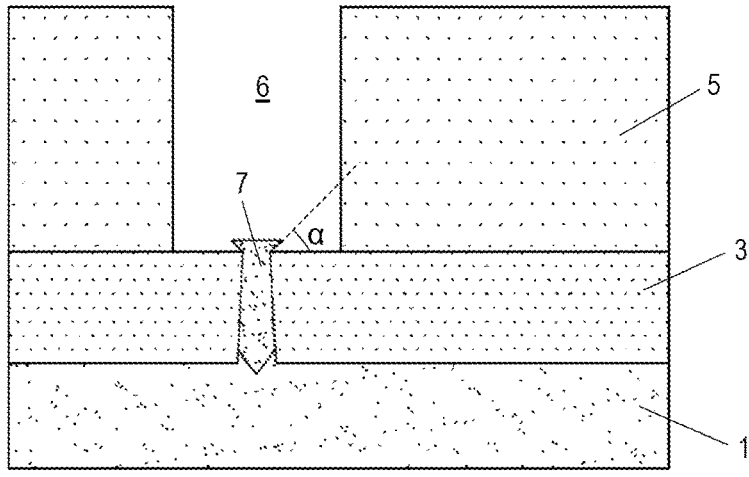
Figure 1E:
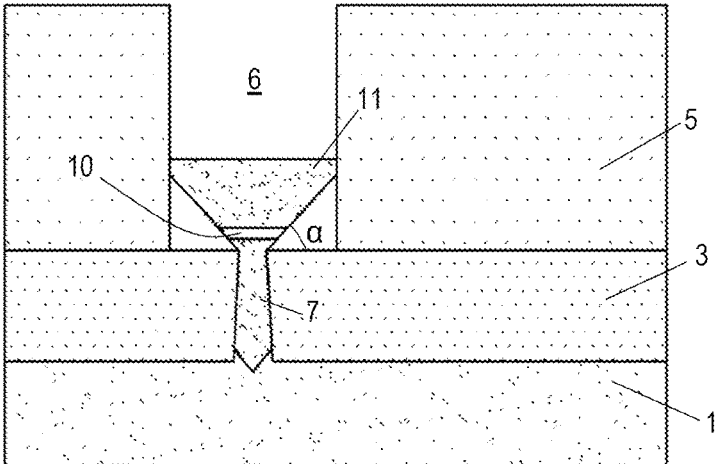
Figure 1F:
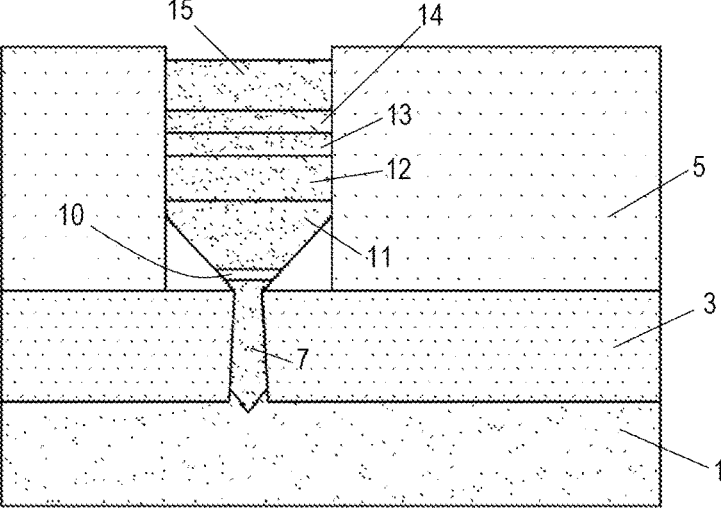
Figure 1G:
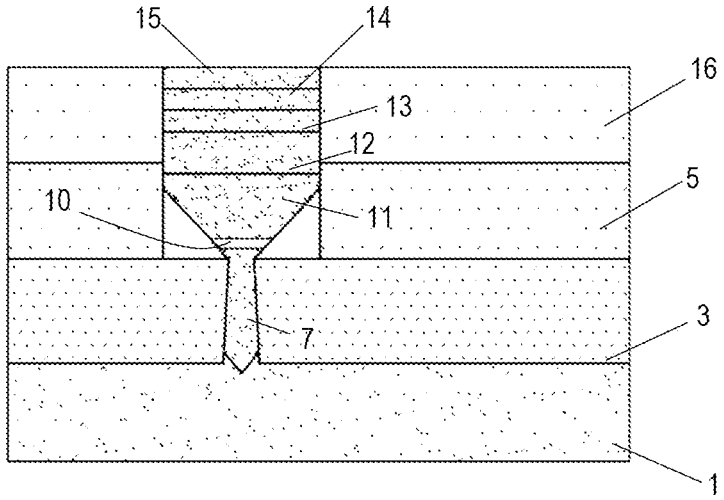
Figure 1H:
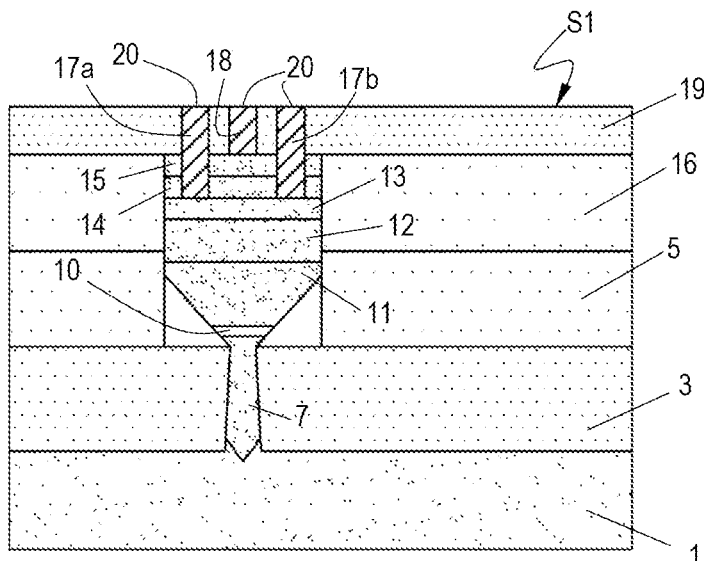
Figure 1I:
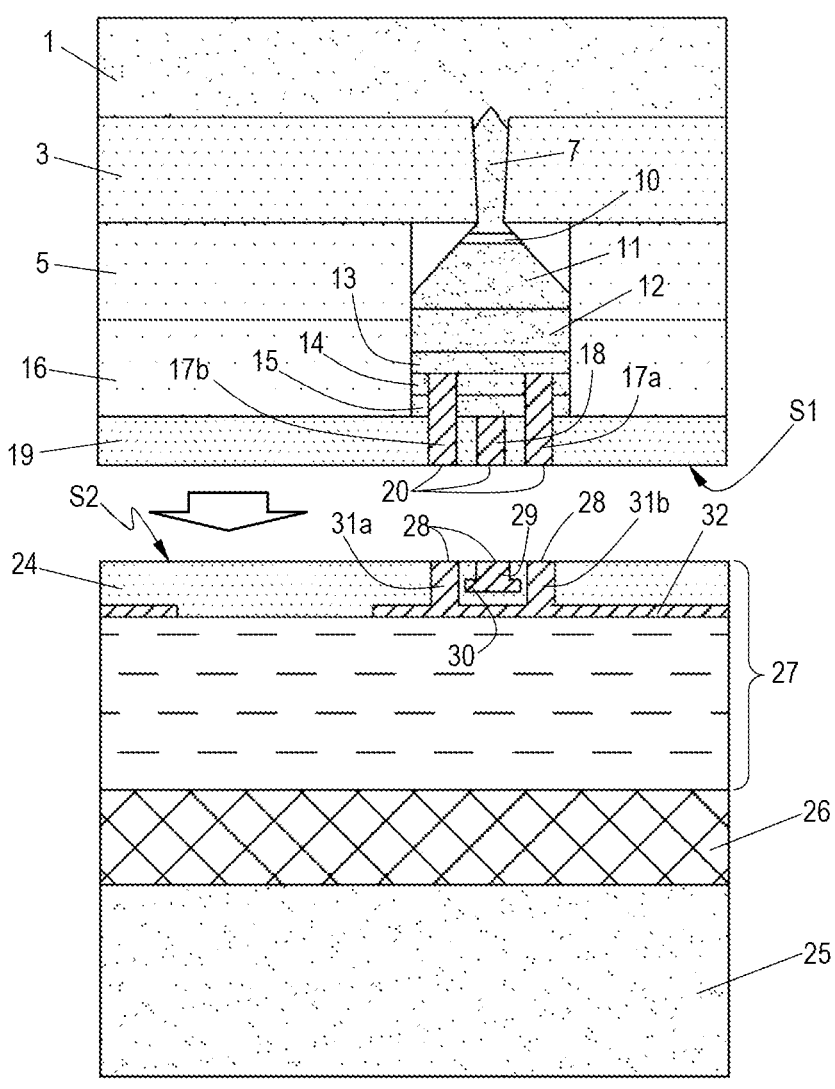
Figure 1J:
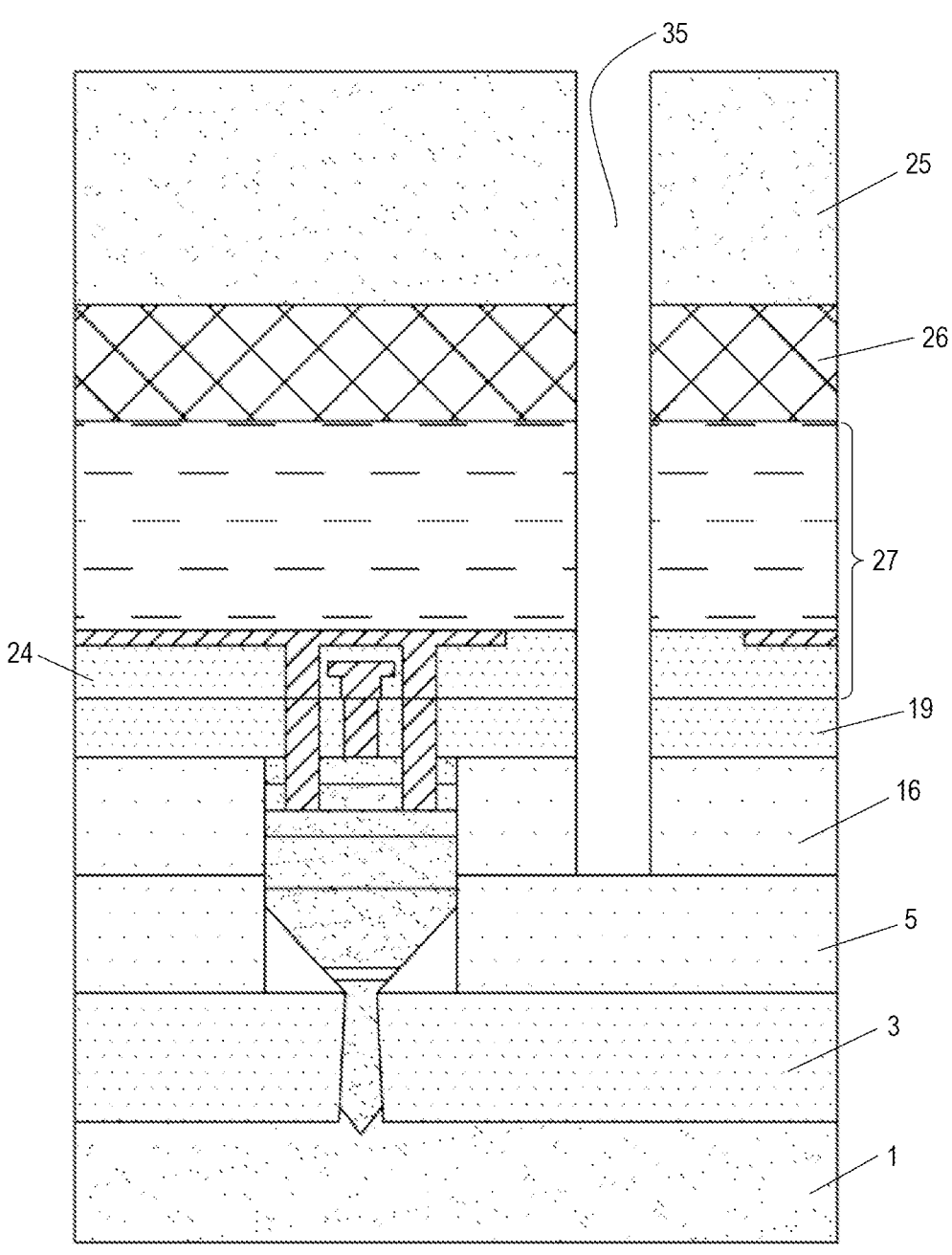
Figure 1K:
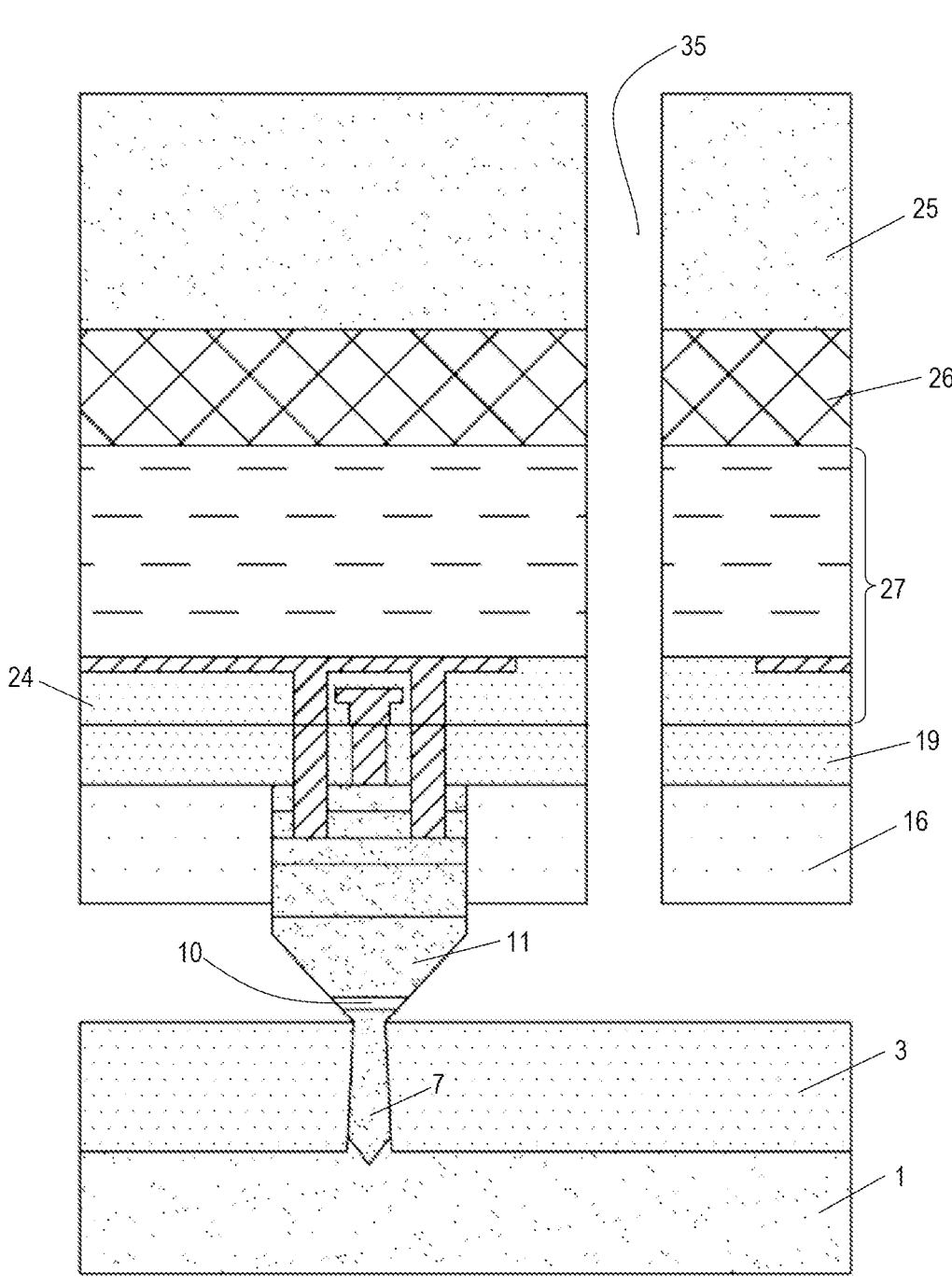
Figure 1I:
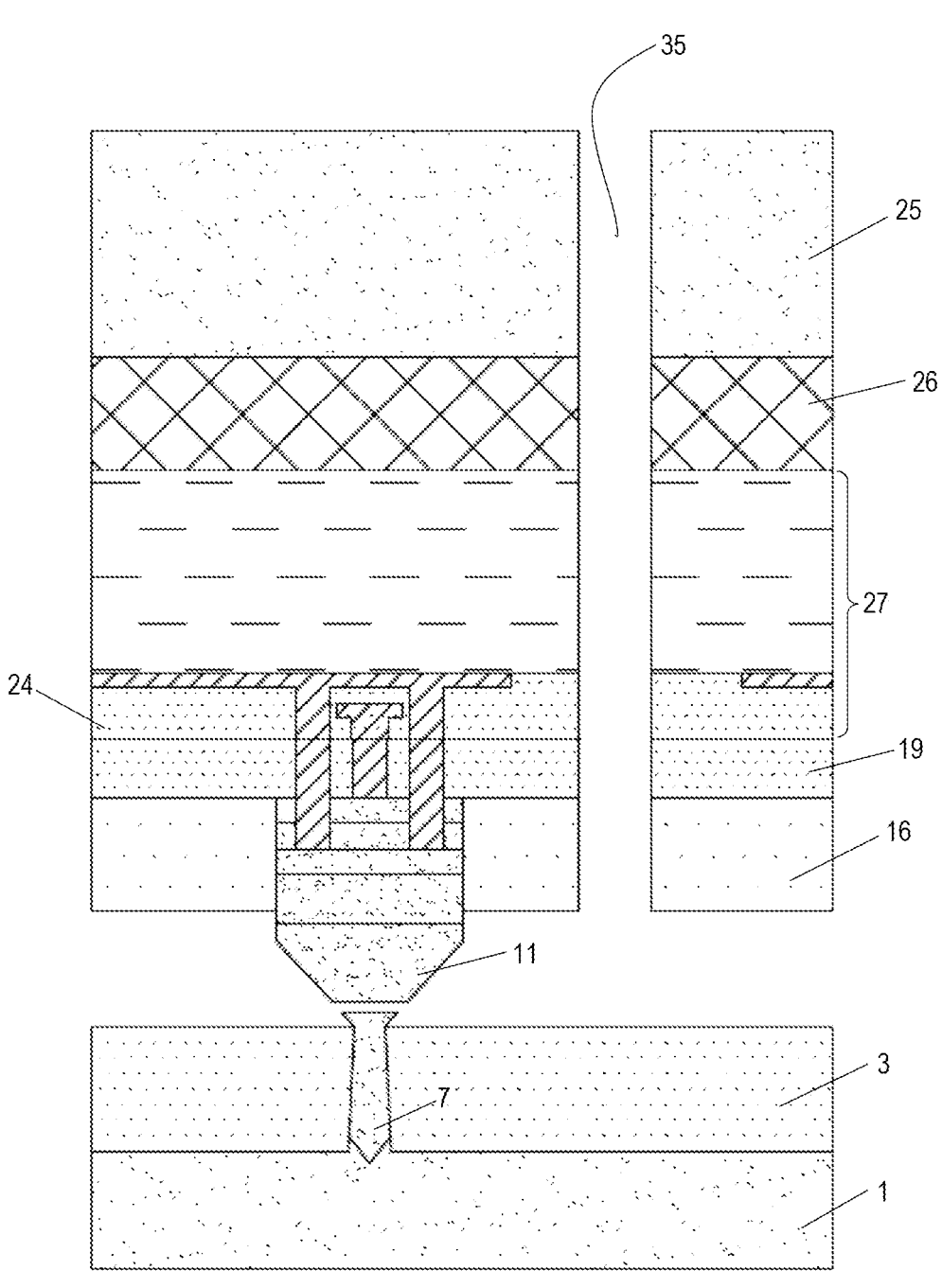
Figure 1M:
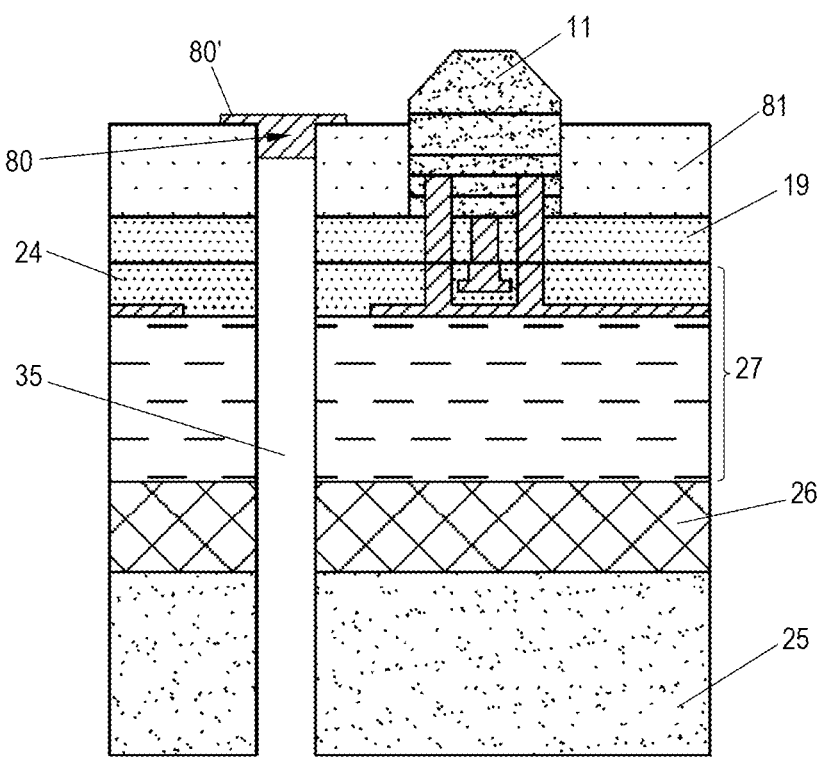
Figure 1N:
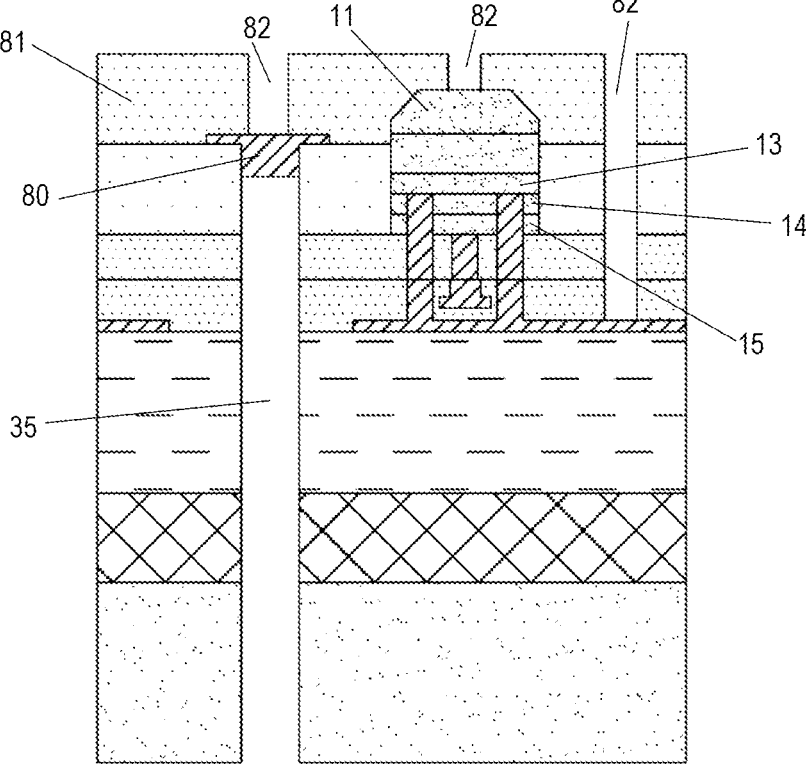
Figure 1O:
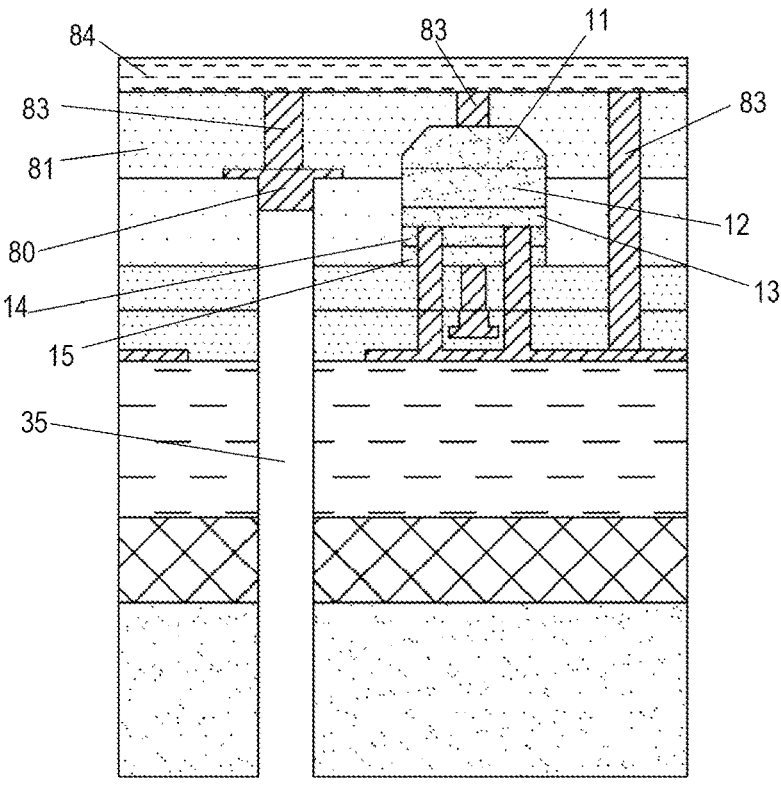
Figure 1P:
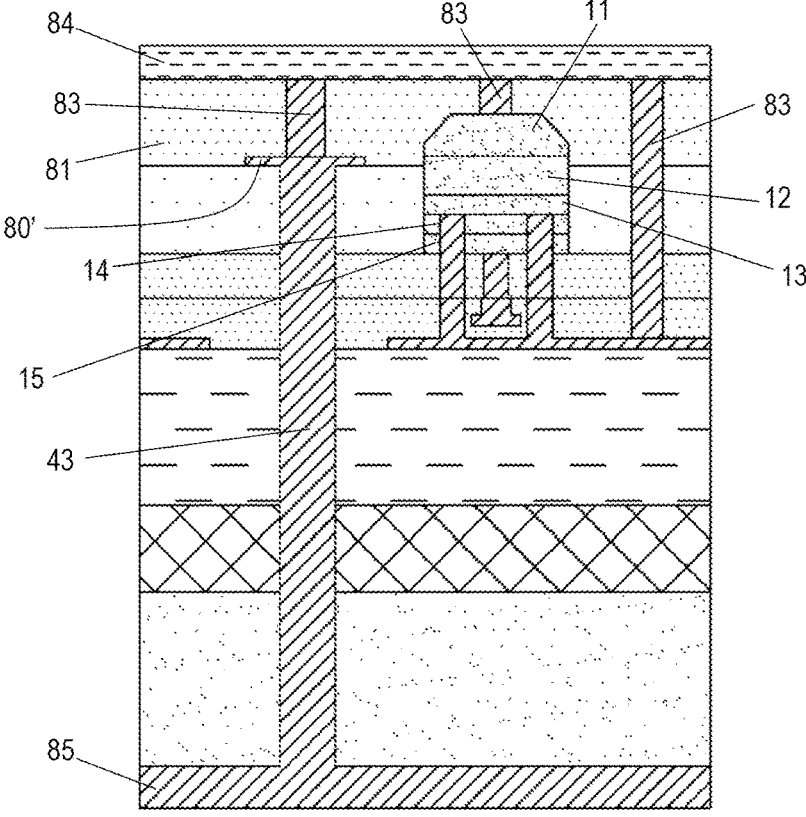

FIGS. 1a to 1p illustrate steps of the present disclosure according to an embodiment for producing a heterojunction bipolar transistor (HBT).

Figure 2A:
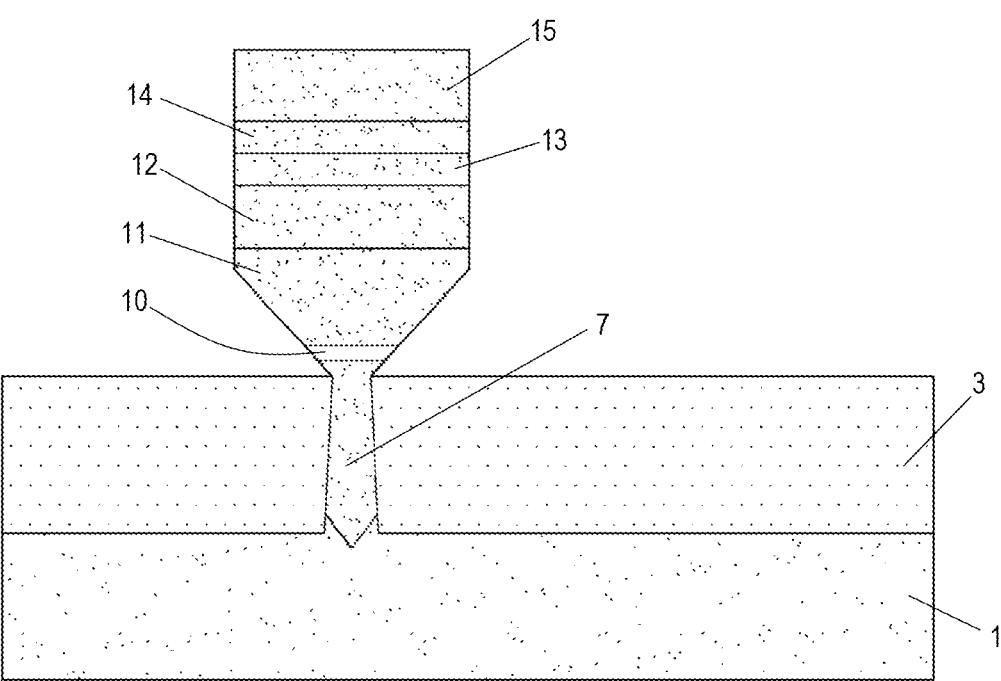
Figure 2B:
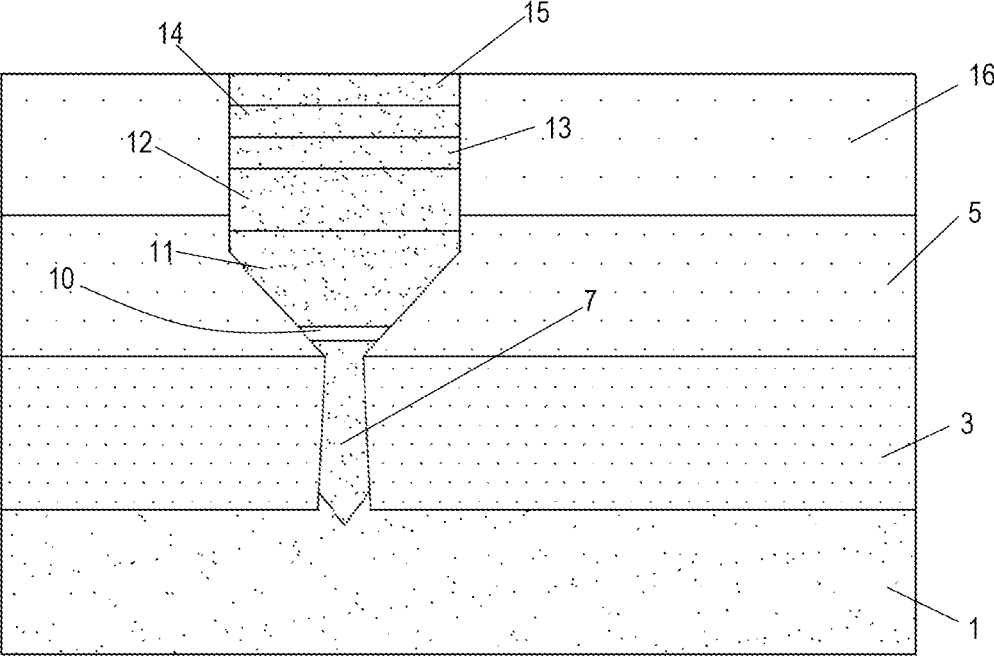

FIGS. 2a and 2b illustrate a way of obtaining a nano-ridge structure embedded in a stack of two dielectric layers according to an embodiment.

FIGS. 3a to 3e illustrate steps of the present disclosure according to an embodiment for producing a high electron mobility transistor (HEMT).

Figure 4:
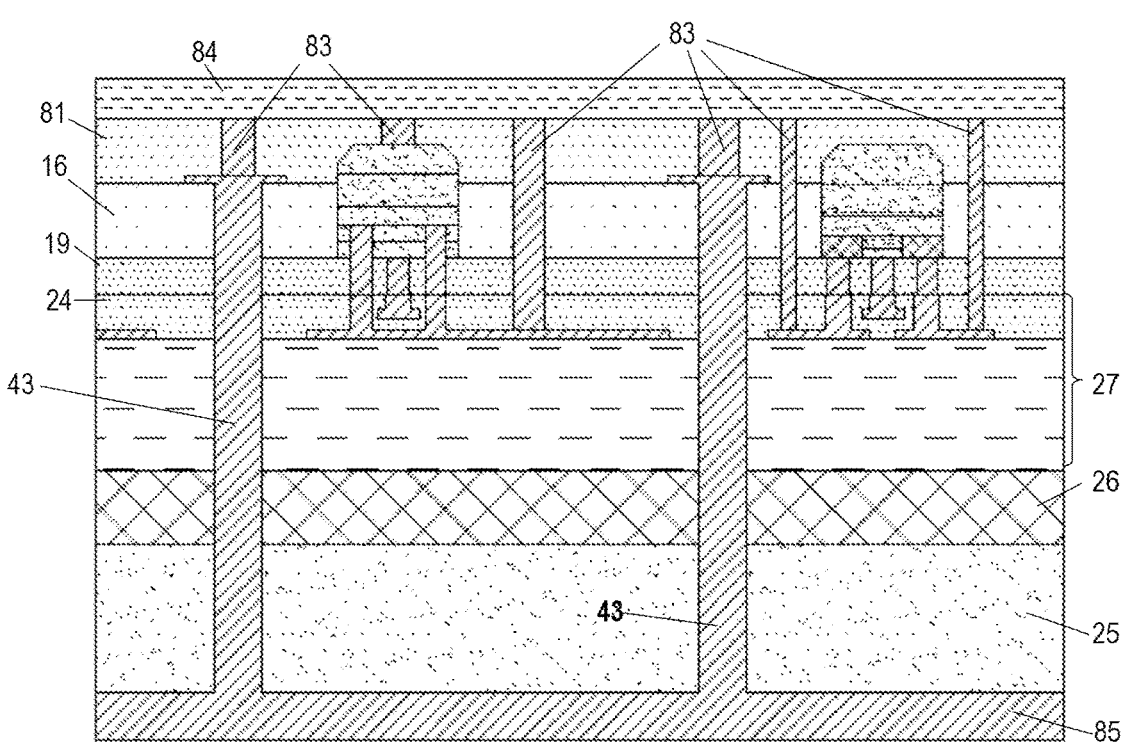

FIG. 4 illustrates an embodiment wherein an HBT and a HEMT device have been produced on the same substrate by an example embodiment.

FIGS. 5a to 5k illustrate steps of present disclosure according to an embodiment for producing an HBT device comprising multiple nano-ridge structures.

FIGS. 6a to 6h illustrate steps of the present disclosure according to an embodiment wherein lattice-matched III-V structures are grown on a Ge donor wafer.

DETAILED DESCRIPTION

The present disclosure includes examples in terms of the type of the device that is produced on the multilayer structure and in terms of the materials and dimensions applied. All statements regarding these features (device type, materials, dimensions) are not limiting the scope of the present disclosure. Embodiments are described wherein the multilayer structure is a nano-ridge structure. Additional embodiments describe larger lattice-matched structures are grown by selective area growth.

FIGS. 1 to 1p illustrate an embodiment of the method of the present disclosure, for producing a heterojunction bipolar transistor (HBT) formed of III-V semiconductor materials obtained by growing a nano-ridge structure, and wherein the HBT is integrated in a semiconductor chip with Si-CMOS. FIG. 1a illustrates a cross section of a small portion of a silicon wafer 1, hereafter referred to as the donor wafer, which may be a standard 300 mm diameter crystalline Si process wafer as known in the art of semiconductor processing. A fin-shaped silicon structure 2 extending in the direction perpendicular to the drawing has been produced by lithography and etching on the upper surface of the wafer. The areas on either side of the fin structure 2 have been filled with a dielectric material 3, which may be silicon dioxide ($SiO_2$). The fin 2 may have slightly slanted sidewalls, as shown in the drawing. The average width of the fin 2 may be in the order of a few tens of nanometres to a few hundreds of nanometres. The height of the fin is such that the aspect ratio of the fin (height/average width) may be higher than 1, or higher than 3. The fin structure 2 may be one of an array of regularly spaced and mutually parallel fins. Several of such arrays may be produced on various areas of the wafer 1.

Processes and process conditions known from finFET technology for producing multiple mutually parallel fins 2 separated by STI (shallow trench isolation) regions 3 are applicable directly for producing the structure shown in FIG. 1a. The oxide layer 3 and the fin 2 are planarized so that the upper surface of the fin and the oxide layer are at the same level, as seen in FIG. 1a.

Then a dielectric layer 5 is produced on the upper surface of the oxide layer 3, see FIG. 1b. The dielectric layer 5 can be an additional silicon oxide layer. Layer 5 is patterned so as to form a trench 6 that is wider than the fin 2 with the longitudinal symmetry planes of the fin 2 and the trench 6 essentially coinciding. The height of the dielectric layer 5 is chosen in accordance with the height of the layers that are intended to be grown in the subsequent process steps, described hereafter.

The material of the fin 2 is then removed relative to the oxide layer 3, as illustrated in FIG. 1c. This is done by a selective etch process that removes the silicon of the fin 2 relative to the silicon oxide layer 3. An option is to use a wet etching process that removes the silicon according to specific crystallographic planes, so that a trench 4 is formed with a V-shaped bottom defined by the {111} Si crystal facets, as illustrated in the drawing. Specifics of suitable etch recipes are well-known in the art and not described here in detail. In the embodiment shown, the depth of the trench 4 is more or less equal to the height of the original fin 2 (i.e., the full height of the fin is removed). The trench 4 could be less deep, but the aspect ratio of the trench (depth/average width) must be high enough to ensure the aspect ratio trapping of the defects in the materials that are epitaxially grown in the trench 4 (see further). In the generic wording applied in the appended claims the oxide layer 3 provided with multiple trenches 4 is referred to as a support layer 3.

The trench 4 can be produced by other methods than the one described above, for example by etching a trench directly in a blanket dielectric layer 3 overlying the substrate 1. In that case the bottom of the trench 4 is not V-shaped, which is however equally allowable in the wider scope of the present disclosure.

By techniques in nano-ridge engineering as such, a first layer 7 is grown selectively by epitaxial growth on the exposed silicon surface at the bottom of the trench 4 (see FIG. 1d). In the embodiment shown, this is a layer of III-V semiconductor material that exhibits a significant lattice mismatch and thermal expansion coefficient mismatch compared to crystalline silicon. The material may be grown by metal organic vapor phase epitaxy (MOVPE) applying known parameters and tools. Details and examples of such parameters and tools are found for example in document EP3789519A1.

The III-V layer 7 fills the trench 4 and when reaching the upper rim of the trench, grows out of the trench. The side planes of the outgrowth are oriented according to an angle α shown in FIG. 1d, the angle being determined by the growth conditions, the crystal plane and the type of material that is being grown.

The upper surface of the layer 7 is essentially defect-free as the defects have become trapped in the narrow trench 4. This is the application of the technique of aspect ratio trapping, known as such in the art and realized by a correct choice of the depth and width of the trench 4 and of the III-V material type and the growth conditions.

A release layer 10 is then grown on top of the first III-V layer 7, as illustrated in FIG. 1e, and a second III-V layer 11 is grown on top of the release layer 10. The term 'release layer' refers to a release step performed later in the process sequence and described further in this description. It is therefore a layer that is selectively removable by etching relative to the III-V materials of the first and second III-V layers 7 and 11 (and relative to a number of other materials as will be described further in this description).

In terms of etch selectivity, various material combinations are possible for the layers 7, 10 and 11. Very high etch selectivity exists between various III-V compounds. For instance, phosphorous containing compounds (e.g. InP, InAsP, InAlP, InAlGaP, InGaP, InGaAsP, GaSbP) can be selectively etched over arsenides (e.g. InGaAs) and vice-versa. Similarly, Sb and Al containing layers (GaAsSb, AlGaAsSb, AlAsSb, InAlAs, InGaAlAs) show high etch selectivity over In, Ga, and P containing compounds (e.g. InP and InGaAs). The release layer 10 and the second III-V layer 11 are grown by epitaxial growth and may grow in the lateral direction according to the same angle a, as illustrated in FIG. 1e. These layers 10 and 11 may however grow according to other directions, depending on the material choice. The thickness of the release layer 10 can be a few tens of nm. This layer 10 can be lattice mismatched with respect to layer 7 as long as it does not exceed the critical thickness, which is the thickness at and above which dislocation defects start to nucleate and propagate from the layer 7 towards the surface of layer 10. Layers 7 and 11 are often formed of the same material. In any case, layer 11 needs to match the lattice constant and thermal expansion coefficient of layer 7, so that the layers 11-15 are essentially defect-free.

In the embodiment shown in the drawings, the growth of the second III-V layer 11 continues along the angle α until the III-V structure reaches the sidewalls of the second trench 6. The III-V material then continues to grow in the direction parallel to the sidewalls of the trench 6, forming a block-shaped upper portion on top of a V-shaped lower portion, which together form the nano-ridge structure as such. The layer 5 thereby contains the lateral growth of the nano-ridge structure.

Depending on the choice of material and the growth conditions, layer 11 could grow on the sidewall of the release layer 10 which can hinder the later removal of the layer 10. In that case, the release layer 10 may be located higher up by growing layer 7 until it reaches the sidewalls of the trench 6 or just before that point, in which case the growth of layer 10 continues till it touches the sidewalls. Layer 11 is then grown after that. Care must however be taken that the release layer 10 is at a location at which it can be removed later in the process (see further in this description).

The growth along an angle a in the order of 450 as shown in the drawings is just one possible manifestation of nano-ridge growth, and the exact manner in which the material grows out of the trench may be different for different materials. Some materials tend to fill the width of trench 6 virtually immediately upon emerging from the narrower trench 4 (i.e. the angle a is about zero degrees).

As shown for example in EP3288067A1, the growth of nano-ridge structures can be obtained also without the presence of the dielectric layer 5. This option is not excluded from the scope of the present disclosure, although the use of the layer 5 often implemented.

In one embodiment shown and related to the production of an npn HBT device, the second III-V layer 11 is a highly n-doped layer configured to serve as the contact layer for contacting the collector of the HBT. The terms "high or low doping" refer to higher or lower doping levels of a given layer. As known in the art, required doping levels may be obtained by adding measured concentrations of dopants to the MOVPE reactor during the growth process.

Then follows, with reference to FIG. 1f, the growth of a low n-doped third III-V layer 12 that will serve as the collector of the HBT, a high p-doped fourth III-V layer 13 that will serve as the base of the HBT and a fifth and sixth III-V layer 14 and 15 which will respectively serve as the emitter (low n-doped) and the contact layer (high n-doped) for contacting the emitter of the HBT.

The described structure is just one example of a layer sequence for producing an HBT device. Instead of the combined layers 11+12 and 14+15, the emitter and/or the collector could be formed of a single n-doped layer. Suitable material choices and doping levels for the various layers are well-known in the art and therefore not described here in detail. The nominations emitter and collector may be reversed depending on the integration scheme into which the HBT is to be integrated. The dopant polarity could be reversed to form a pnp transistor instead of an npn transistor. It is to be understood furthermore that even though only one nano-ridge structure is shown, a plurality of such structures having the same layer structure is normally produced simultaneously on the donor wafer, often in the form of an array of mutually parallel nano-ridges. Possibly multiple arrays of nano-structures, each having a different layer sequence, may be produced consecutively on various parts of the donor wafer, for the production of different types of III-V devices.

With reference to FIG. 1g, the dielectric layer 5 is then thinned relative to the nano-ridge structure, which may be realized by a suitable selective etch process, and an additional dielectric layer 16 is deposited on the thinned layer 5, after which the upper surface of the additional dielectric layer 16 and of the nanoridge structure is planarized, resulting in the image shown in FIG. 1g, wherein the upper III-V layer 15 has been thinned due to the planarization process. The additional dielectric layer 16 is formed of a material with respect to which the first layer 5 can be selectively etched, i.e. an etching recipe is available that removes the first layer 5 while essentially not removing the additional layer 16. When the first layer 5 is a silicon oxide layer, the layer 16 may for example be a nitride, such as silicon nitride. These selective etch properties are relevant in relation to a process step that will be described further in this description.

The stack of dielectric layers 5 and 16 forms the "template layer", as referred to in the appended claims, and formed of a stack of a first sublayer 5 and a second sublayer 16. As seen in FIG. 1g, the template layer 5+16 is directly adjacent and in direct contact with the sidewalls of the nano-ridge structure, the sidewalls extending in the longitudinal direction of the structure, while the upper layer 15 of the nano-ridge structure is exposed.

In the embodiment shown, the release layer 10 is formed on the first III-V layer 7, and all the subsequent III-V layers are formed on the release layer 10. It is also possible to first form one or more further III-V layers on the first layer 7, followed by the release layer 10 and a further one or more III-V layers. For the purpose of the release steps described further, it is required that the release layer 10 is accessible from the sides when the first sublayer 5 is removed. In some embodiments, this means that the release layer 10 lies between the top and bottom surfaces of the first sublayer 5 of the template layer 5+16, as is the case in the embodiment shown. The thickness of the release layer 10 could also overlap the top or bottom surface of the first sublayer 5. In other words, it is required that at least the bottom or top surface of the release layer 10 is lying between the bottom and top surfaces of the first sublayer 5. The terms "bottom and top surfaces of a layer" in the latter definition are in fact the interfaces with the layers lying below and on top of the layer in question.

The next step concerns the production of electrically conductive paths, often formed of metal conductors, for electrically contacting the base and the emitter layers (in the "emitter-up" HBT scheme, the emitter is above the collector in the nano-ridge stack), illustrated in FIG. 1h. The conductive paths are represented as metal conductors fully or partially embedded in a dielectric layer 19. Two conductive paths 17a and 17b contact the base 13 and one conductive path 18 contacts the emitter's contact layer 15. The upper surface of the dielectric layer 19 and the conductive paths 17a/17b and 18 is planarized, resulting in a bonding surface S1 comprising the surface of the dielectric layer 19 and three contact pads 20 lying in the same plane and respectively connected to the paths 17a, 17b and 18. When the paths 17a/17b/18 are pillar-shaped as shown in the drawing, the pads 20 may have a larger cross-section than the pillars instead of having the same cross section. In practice, the fabrication of the conductive paths and the contact pads is more complex but as the various fabrication details are well-known in the art, the simplified representation is sufficient for the purpose of describing the present disclosure. For example, at least a portion of the conductive paths 17a and 17b contacting the base is surrounded by a dielectric liner to avoid direct contact to the emitter 14 and the emitter contact layer 15. Also, each of these conductive paths could have a pillar shape as shown in the drawings, but they could also be realized in the form of multiple interconnect vias and interconnect lines arranged in a multilevel interconnect structure on top of the FIBT device, with the contact pads 20 forming terminals on the upper surface of the interconnect structure. The dielectric layer 19 may be a stack of several layers embedding the various levels of the interconnect structure. The top dielectric layer, whose upper surface is in effect the bonding surface S1, may be a specific dielectric bonding layer, chosen on the basis of its suitability to be used in a direct dielectric-to-dielectric bonding process.

With reference to FIG. 1i, a second silicon wafer 25 is provided having at least the size of the donor wafer 1, and comprising on its surface a front end of line (FEOL) layer 26 and a back end of line (BEOL) layer 27. The second wafer 25 will be referred to hereafter as the carrier wafer. Only a top portion of the carrier wafer 25 is shown, having for example a thickness of a few tens of μm. The carrier wafer 25 has a much higher thickness in the order of 800 μm for example. The FEOL layer 26 is obtained by known semiconductor processing technology such as Si-CMOS or silicon photonics, and comprises a plurality of active devices such as transistors and diodes arranged according to a given chip architecture for a plurality of semiconductor chips produced on the carrier wafer 25. The BEOL layer 27 is a multilayer interconnect structure as referred to above, comprising multiple levels of interconnected vias and lines embedded in dielectric material and configured to connect to the devices of the FEOL layer. The top level of the BEOL layer is shown in more detail and is seen to comprise three contact pads 28 which are coplanar with a dielectric bonding surface S2, being the top surface of a dielectric layer 24. The central contact pad 28 is coupled through an interconnect via 29 to a metal line 30 oriented in the direction perpendicular to the drawing, while the two lateral pads 28 are connected through respective vias 31a and 31b to a common line 32 parallel to the plane of the drawing. The pads 28 are located relative to each other so as to enable the direct bonding and interconnection of the pads 20 of the donor wafer 1 to the pads 28 of the carrier wafer 25, by aligning and bonding the wafers in the manner illustrated in FIG. 1i. The bonding process is a hybrid bonding process known as such in the art, wherein the respective hybrid bonding surfaces S1 and S2 are brought into mutual contact and bonded under increased temperature and possibly by applying a given pressure.

The bonded assembly of the wafers is then flipped, as illustrated in FIG. 1j, and a plurality of through semiconductor via openings (TSVs) 35 is produced from the back side of the carrier wafer 25. Only one TSV opening 35 is shown in the drawing for illustration. The production of these narrow openings through the full thickness of the wafer is well known from 3D technology and applied for example for creating thermal shunts and wafer-to-wafer metal connections. The TSVs produced as part of the method of the present disclosure could be TSVs applied for such a purpose, but they have an additional function in the method of the present disclosure, as described hereafter.

In some embodiments, the wafer 25 is thinned before producing the TSV openings 35. In order to maintain the structural stability of the wafer, thinning may be done only on a portion of the wafer by etching away the wafer material in an area of the wafer down to a remaining thickness of about 50 μm for example. The TSV openings 35 are then etched through the remaining thickness, and may have a diameter in the order of 1 or 2 μm for example. The FEOL and BEOL portions 26 and 27 and the locations of the TSV openings are configured so that the TSV openings do not interfere with the active devices and interconnect present respectively in the FEOL and BEOL portions.

As seen in FIG. 1*j*, the TSV opening 35 is etched by anisotropic etching through various layers, including the (in some examples, thinned) carrier wafer 25 as such, the FEOL and BEOL layers 26 and 27, the dielectric layers 24 and 19 of the bonded wafer assembly, and the second sublayer layer 16 of the template layer 5+16. The etching stops on the interface between the two sublayers 5 and 16, or the etching could continue a little further into layer 5 without however passing through its full thickness. A dielectric liner (not shown) is may be deposited on the sidewalls of the TSV opening 35. For example this may be a silicon nitride layer applied to protect the oxide layers of the BEOL portion 27. The liner may be deposited on the sidewall and the bottom of the TSV opening 35, and subsequently removed from the bottom by a known plasma etch.

The first sublayer 5 of the template layer 5+16 is then removed by etching the layer 5 selectively with respect to the second sublayer 16 and with respect to all III-V nano-ridge structures across the full surface of the wafers 1 and 25, taking advantage of the etch selectivity properties described above. According to an embodiment, the etchant is supplied through the TSV openings 35. When a sufficiently high number of TSV openings are produced, this allows the removal of the sublayer 5 to take place in a short timespan, compared to supplying the etchant only from the sides of the wafer assembly. As seen in FIG. 1*k*, the wafers are now connected only through the III-V nano-ridge structures (of which only one is shown in the drawing).

At this point, another etchant is supplied through the TSV openings 35, that removes the release layer 10 of the III-V nano-ridge structures selectively with respect to the adjacent III-V layers 7 and 11, leaving all the other layers such as layer 16 and layer 3 essentially intact, thereby effectively releasing the carrier wafer 25 from the donor wafer 1, as illustrated in FIG. 1*l*.

In the above, the etchant is supplied through the TSV openings 35 for the removal of the sublayer 5 and/or for the removal of the release layer 10. If applied for only one of these two layers, the etchant is supplied from the side of the wafer assembly for the removal of the other layer. However, the etchant is supplied through the TSV openings 35 for removing the sublayer 5 as well as for removing the release layer 10.

The released donor wafer 1 can be re-used for subsequent transfer processes.

Following the release step, the carrier wafer 25 is again flipped and placed on a support surface (not shown), and now comprises the HBT device on its upper surface. A part of the original nano-ridge structure has been removed, and the back side 11 of the remaining part is exposed, as illustrated in FIG. 1*m*. With reference to the same FIG. 1*m*, a metal layer 80 is deposited and patterned by lithography and etching. The metal fills the upper region of the TSV openings 35, thereby closing off the openings. The patterning removes the metal except in a limited area extending above and around the TSV openings 35, forming contact pads 80' at these locations.

Reference is then made to FIG. 1*n*. A dielectric layer 81 is deposited and subsequently thinned and planarized, thereby removing a portion of the collector contact layer 11. The same dielectric 81 is again deposited, covering the thinned collector contact layer 11, after which the upper surface is again planarized. Then via openings 82 are formed by lithography and etching. FIG. 1*n* shows two via openings 82 for contacting the collector contact layer 11 and the base 13 respectively. Together with these openings, another via opening is produced lying outside the plane of the drawing, for contacting the emitter 14, through its contact layer 15. The via openings 82 to the base 13 and the emitter 14 expose contact lines in the upper level of the BEOL portion 27 which are connected to the base and the emitter through the bonded contact pads. With reference to FIG. 10, these via openings 82 are filled with metal (often after deposition of a dielectric liner) to create via interconnects 83, and a redistribution layer 84 is produced that couples the via interconnects 83 connected to the collector 12 (through contact layer 11) and the base 13 to respective terminals on top of the layer 84 (not shown), or to an antenna incorporated in the redistribution layer 84, the antenna receiving power through the HBT. The redistribution layer 84 may be a single or multilevel interconnect structure similar to the BEOL portion 27.

Then the wafer is flipped and the TSV openings 35 are filled with metal (see FIG. 1*p*), thereby forming TSVs 43. A thick metal layer 85 may then be formed on the back side acting as a ground layer. The emitter 14 is connected to this ground layer 85, through the redistribution layer 84 and one or more of the TSVs 43. The collector 12 and the base 13 are not connected to the ground layer 85.

When the wafer processing is finished, possibly including the production of passivation layers on the front and/or back sides and possibly contact terminals on the front and/or back sides (not shown in the drawings), the wafer 25 may be singulated to form a chip comprising the HBT and possibly further III-V devices formed on other nano-ridge structures. The HBT and these other devices are integrated with the Si-CMOS devices in the FEOL portion 26 of the chip.

The manner in which the base, emitter and collector are connected to the front or back of the wafer may be different from what is described above, which is to be considered as a mere example of how the nano-ridge structure may be further processed after the bonding step and the removal of the donor substrate.

In this way, semiconductor chips may be produced comprising one or more III-V based HBT devices integrated with Si-based active devices in the FEOL layer 26 of the carrier wafer 25. The co-integration of the III-V devices with Si-based technology does not require the deposition of III-V material on the silicon of the carrier wafer 25. The deposition of III-V material on silicon takes place on a separate wafer that can be re-used after transfer of the III-V devices. No thermal budget issues arise because the III-V material processing is not done on the same wafer as Si-CMOS processing or other Si-based processing technology. The use of nano-ridge structures means that defect-free III-V layers are integrated with the Si-technology without high III-V materials costs. When applied on a 300 mm Si donor wafer 1, the method enables to fabricate high-performance III-V devices and chips on the grown III-V material using a CMOS compatible, cost-efficient, and scalable process flow in a 300 mm cleanroom environment. The application of etchant through the TSV openings enables the fast removal of the sublayer 5 of the template layer 5+16 and/or of the release layer 10.

FIGS. 2a and 2b illustrate an alternative embodiment of a number of steps of the above-described method for producing an HBT device. As seen in FIG. 2a, the first III-V layer 7, the release layer 10 and the subsequent III-V layers 11 to 15 are grown without the presence of the first dielectric layer 5, and the shape of the growth occurs naturally as a function of the choice of the III-V materials and the growth conditions as described for example in document EP3789519A1. As illustrated in FIG. 2b, the first dielectric layer 5 is deposited after the completion of the III-V stack 7-15, followed by the deposition of the second dielectric sublayer 16, the sublayers 5 and 16 together forming the template layer. After that, the same steps are performed as described with reference to FIGS. 1h to 1m.

It is also possible to form both the first and second sublayers 5 and 16 prior to growing the nano-ridge structure. In that case, both layers 5 and 16 are formed consecutively, and the trench 6 is formed in the stack of these two layers, prior to growing the nano-ridge structure. In the latter case, both layers 5 and 16 are configured to contain the lateral growth of the nano-ridge structure.

Figure 3A:
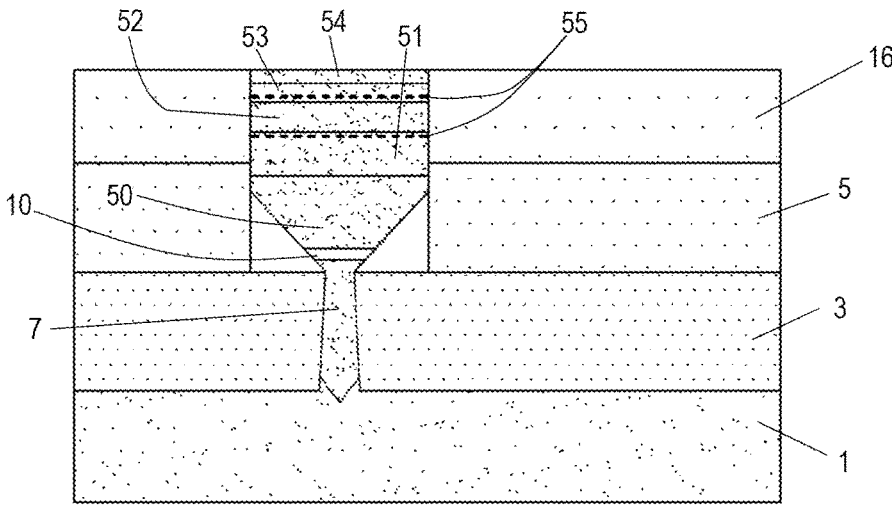

FIGS. 3a to 3e illustrate another embodiment of the present disclosure, wherein a High Electron Mobility transistor (HEMT) is produced on the donor wafer 1 and subsequently transferred to the carrier wafer 25. With reference to FIG. 3a, the stack of III-V layers is now configured for the production of this type of device. The stack comprises again the first III-V layer 7 and the release layer 10 which may be the same as described above with reference to the HBT device. After that however, the III-V layer sequence is different from the HBT stack and comprises a buffer layer 50, a first barrier layer 51, a channel layer 52, a second barrier layer 53 and a contact layer 54. 2-dimensional electron gas (2-DEG) layers 55 are realized by pulse doping in the barrier layers. Suitable material choices, doping levels and layer thicknesses for these layers are well known in the art and therefore not described here in detail.

Figure 3B:
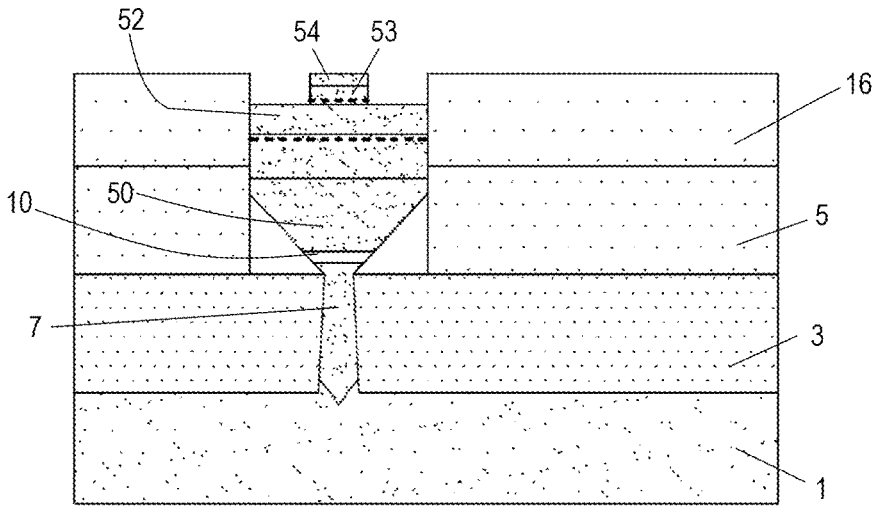
Figure 3C:
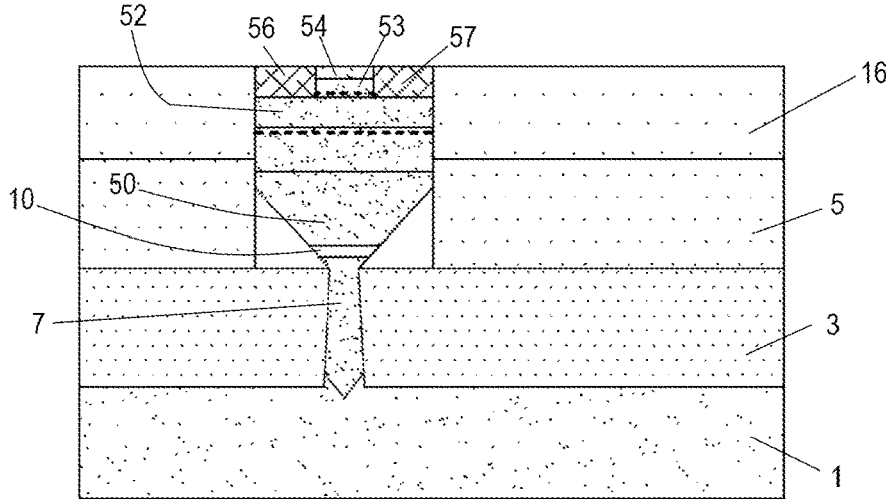
Figure 3D:
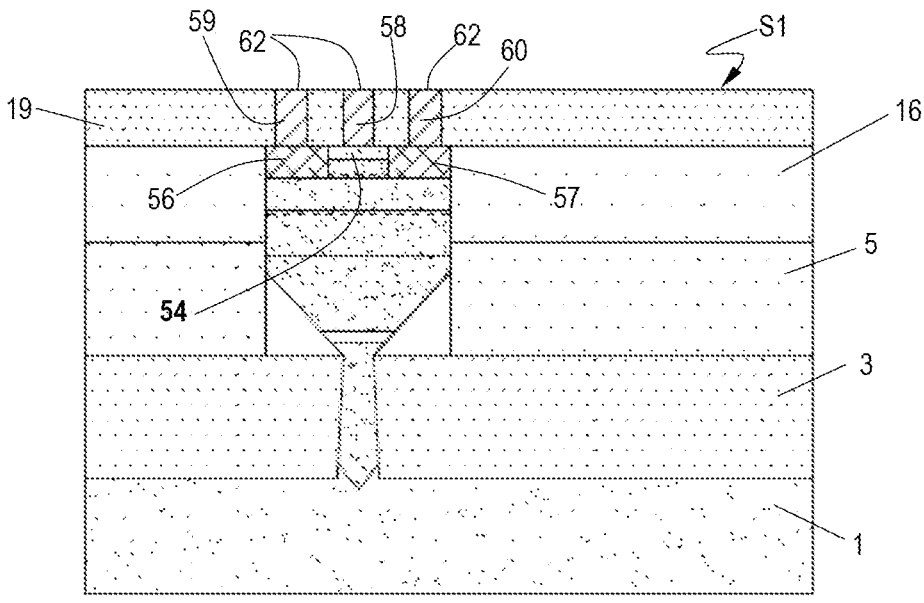

The template layer 5+16 is again present and may be produced in any of the manners described above. As seen in FIG. 3b, a patterning step is applied wherein the contact layer 54 and the second barrier layer 53 are etched back on either side of a central portion of the layers, the central portion thereby forming a gate contact area. With reference to FIG. 3c, this is followed by the growth of source and drain contact layers 56 and 57 by selective epitaxy of III-V material on the exposed areas of the channel layer 52. The upper surface is then planarized and three conductive paths 58, 59 and 60 are produced, embedded in a dielectric layer 19, for contacting respectively the gate, source and drain contact layers 54, 56 and 57 (see FIG. 3d). The conductive paths terminate in contact pads 62 which are coplanar with a dielectric bonding surface SI, in the same manner as described above for the HBT device.

Figure 3E:
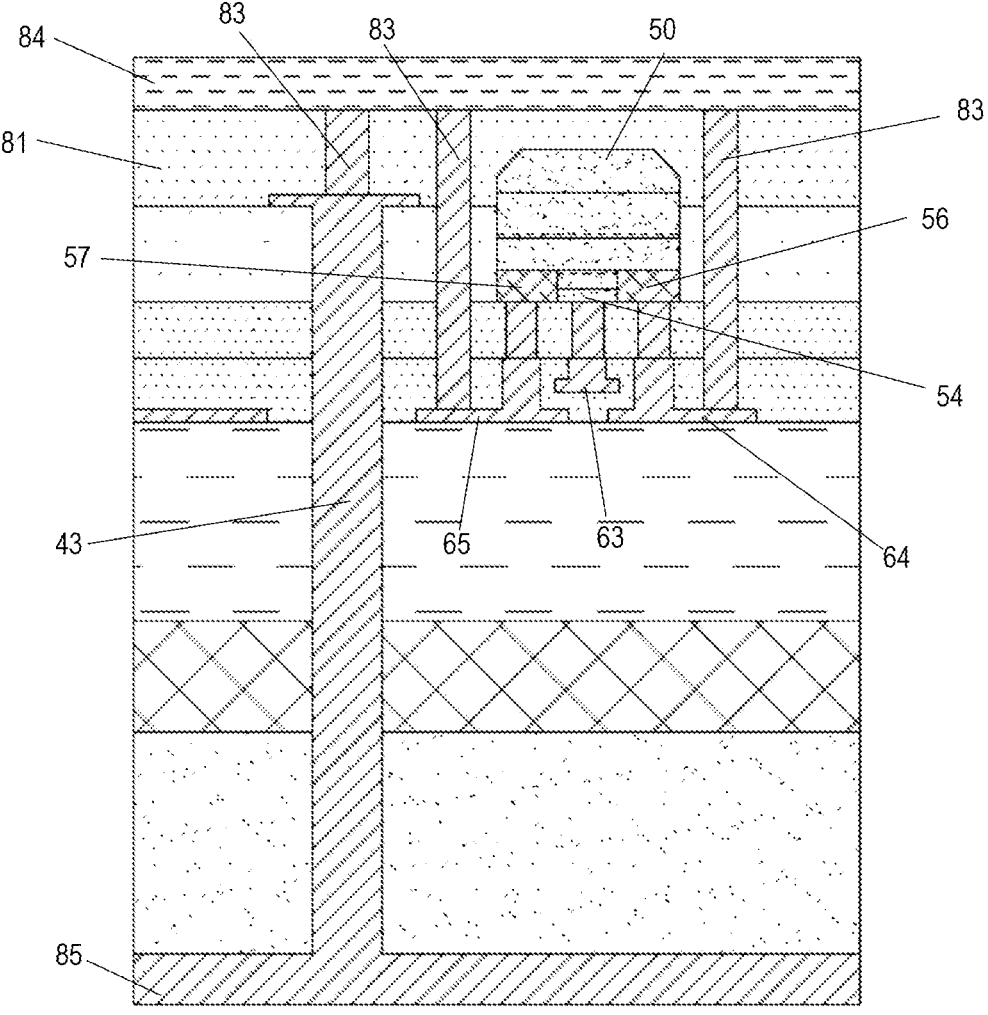

Bonding of the donor wafer 1 to the carrier wafer 25 takes place also in the same manner as described for the HBT device, as well as the steps of producing TSV openings 35 through the carrier wafer 25, and removing the first sublayer 5 and the release layer 10. FIG. 3e shows a possible final structure. The gate, drain and source are respectively coupled to interconnect lines 63, 64 and 65 in the upper level of the BEOL layer 27 of the carrier wafer 25. Via interconnects 83 couple the source and drain to a redistribution layer 84. The gate is also coupled to the redistribution layer 84 by a via interconnect lying outside the plane of the drawing. The TSV 43 again connects the redistribution layer 84 to a metal ground layer 85 on the back side of the wafer 25. According to an embodiment, the drain contact 57 and the gate contact 54 are connected through the redistribution layer 84 to respective contact terminals on the front side, while the source contact 56 is connected through the redistribution layer 84 and the TSV 43 to the metal layer 85 on the back side. The gate and the drain are not connected to the ground layer 85.

The redistribution layer 84 and the metal layer 85 may be coupled to other III-V devices, for example one or more HBTs produced on the same donor wafer as the HEMT, as illustrated in FIG. 4. Such embodiments wherein different types of III-V devices are produced on the same donor wafer 1 can be realized by producing the different device types consecutively, using a masking layer that covers a first subgroup of narrow trenches 4 while exposing a second subgroup of trenches 4, followed by the growth of a first III-V stack type in the exposed trenches. Then the masking layer is removed and a second masking layer is deposited covering the first III-V stacks, followed by the growth of a second III-V stack type in the now exposed trenches 4.

Figure 5A:
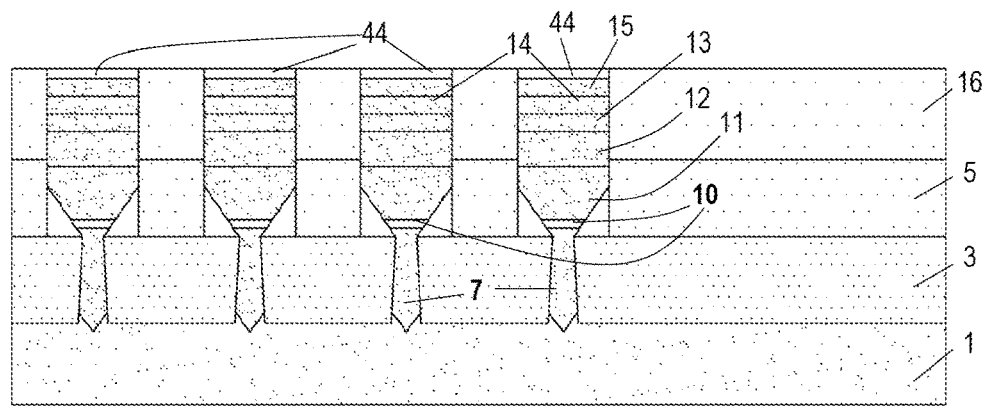
Figure 5B:
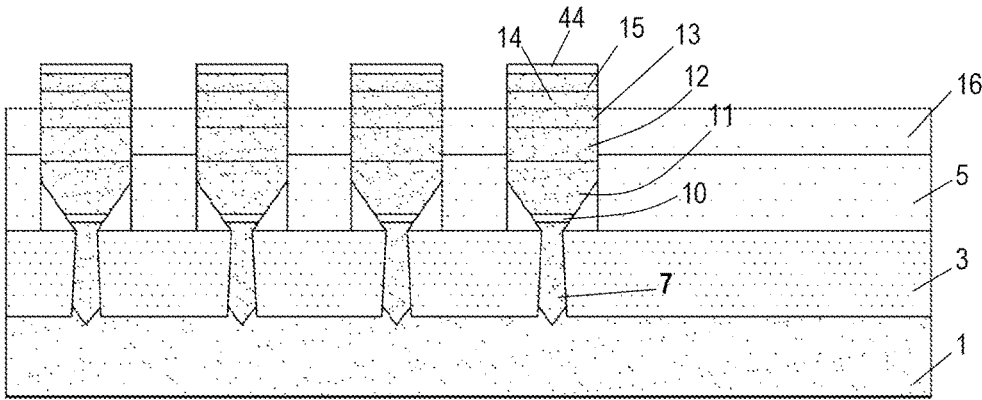
Figure 5C:
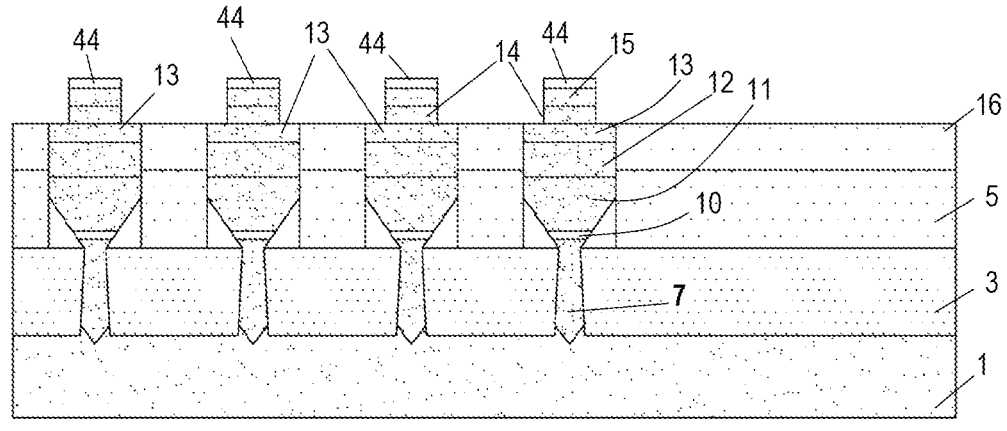

Another embodiment is illustrated in FIGS. 5a to 5k. This concerns the production of an HBT device comprising four III-V nano-ridge structures and a base layer that is epitaxially regrown. The formation of four adjacent III-V nanoridge stacks may be done in accordance with the methods described above, and results in the image shown in FIG. 5a. Each stack comprises a first III-V layer 7 grown simultaneously in four adjacent narrow trenches 4, a release layer 10, and second to sixth III-V layers 11 to 15 as described in relation to the first embodiment and numbered by the same reference numerals. Also in the same way as in the first embodiment, a dielectric template layer formed of a stack of sublayers 5 and 16 is present between the III-V stacks, with the first sublayer 5 being selectively removable relative to the second sublayer 16. By comparison to one of the previous embodiments is shown: a dielectric layer 44 is formed on the nano-ridge structures. Layer 44 may be obtained for example following the planarization of the nano-ridge structures and the second sublayer 16, by partially etching back the top layers 15 relative to the second sublayer 16, filling the obtained cavities with a dielectric and again planarizing the upper surface. With reference to FIG. 5b, the second sublayer 16 is partially etched back, revealing the fifth and sixth III-V layers 14 and 15 of the four stacks, and these layers 14 and 15 are patterned as shown in FIG. 5c. The applied etch recipe is such that layer 16 is removed relative to layers 44, i.e. these layers 44 remain on top of the III-V structures.

As in the previous embodiment, layers 14 and 15 are configured to constitute the emitter layer and the emitter contact layer, whereas layers 12 and 11 are configured to constitute the collector layer and the collector contact layer of the HBT device that will be the end product of this particular sequence.

Figure 5D:
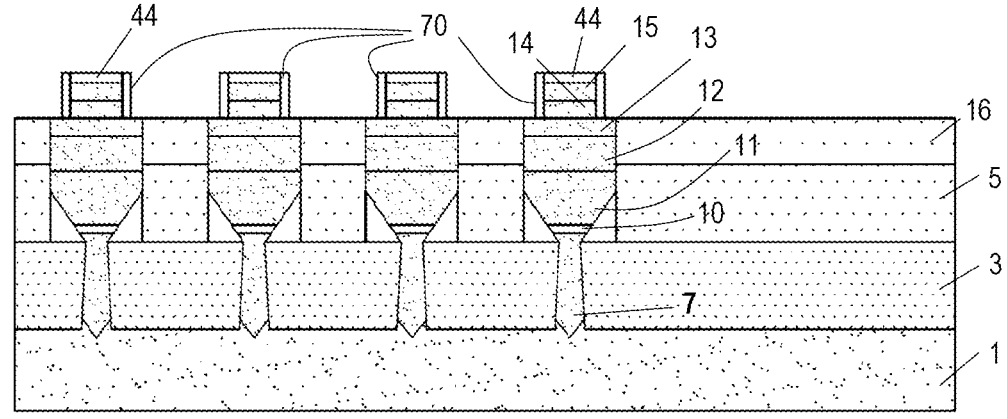

In each stack, a lateral portion of the layers 14, 15 and 44 is removed on either side of a central portion, revealing the base layer 13 on either side of the central portion (see FIG. 5c). A dielectric liner 70 is then deposited conformally and subsequently etched back from the level surfaces while remaining on the sidewall surfaces, as shown in FIG. 5d, so that the base layers 13 and the sublayer 16 are exposed.

Figure 5E:
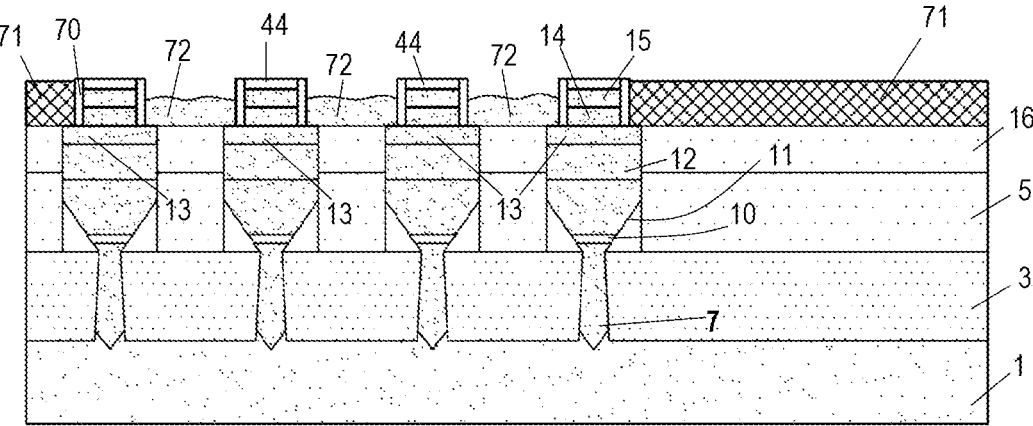

With reference to FIG. 5e, a mask layer 71 is then formed, covering the areas on either side of the four III-V stacks, including the lateral portions of the base layer 13 of the first and fourth stack. Alternatively, the mask 71 may leave the lateral portions of the base layer 13 of the first and fourth stack exposed. On the remaining exposed areas of the base layers 13, the III-V material of the base layer is then grown by epitaxial growth until the grown material merges between the nano-ridge structures, thereby forming a continuous extended base area comprising the original base layers 13 of the III-V stacks, and base contact portions 72 in between the stacks. The epitaxially grown contact portions 72 may have a higher doping level than the original base layers 13. If the lateral base portions of the first and fourth stack have remained exposed, additional lateral base portions are grown thereon.

Figure 5F:
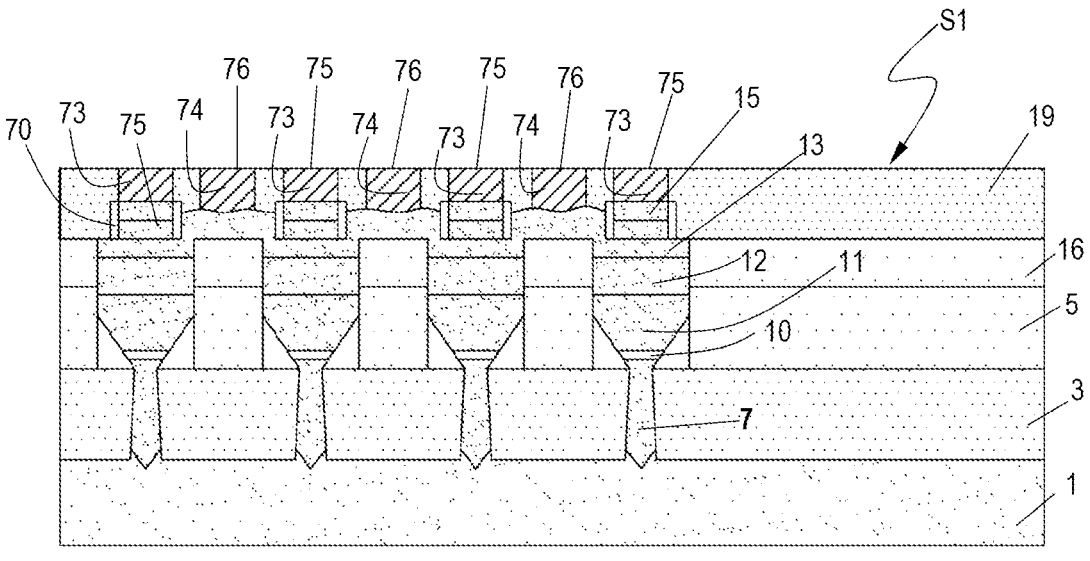

With reference to FIG. 5f, the mask layer 71 and the horizontal part of the liners 70 are removed and electrically conductive paths 73 are then formed for contacting the emitter contact layers 15 of the four stacks, as well as conductive paths 74 for contacting the base contact portions 72. The respective conductive paths 73 and 74 are coupled to respective contact pads 75 and 76 which are coplanar with the bonding surface SI of a dielectric layer or stack of dielectric layers 19. If additional lateral base portions have been grown on the first and fourth stack, additional paths 74 can be formed to contact the additional base portions.

Figure 5G:
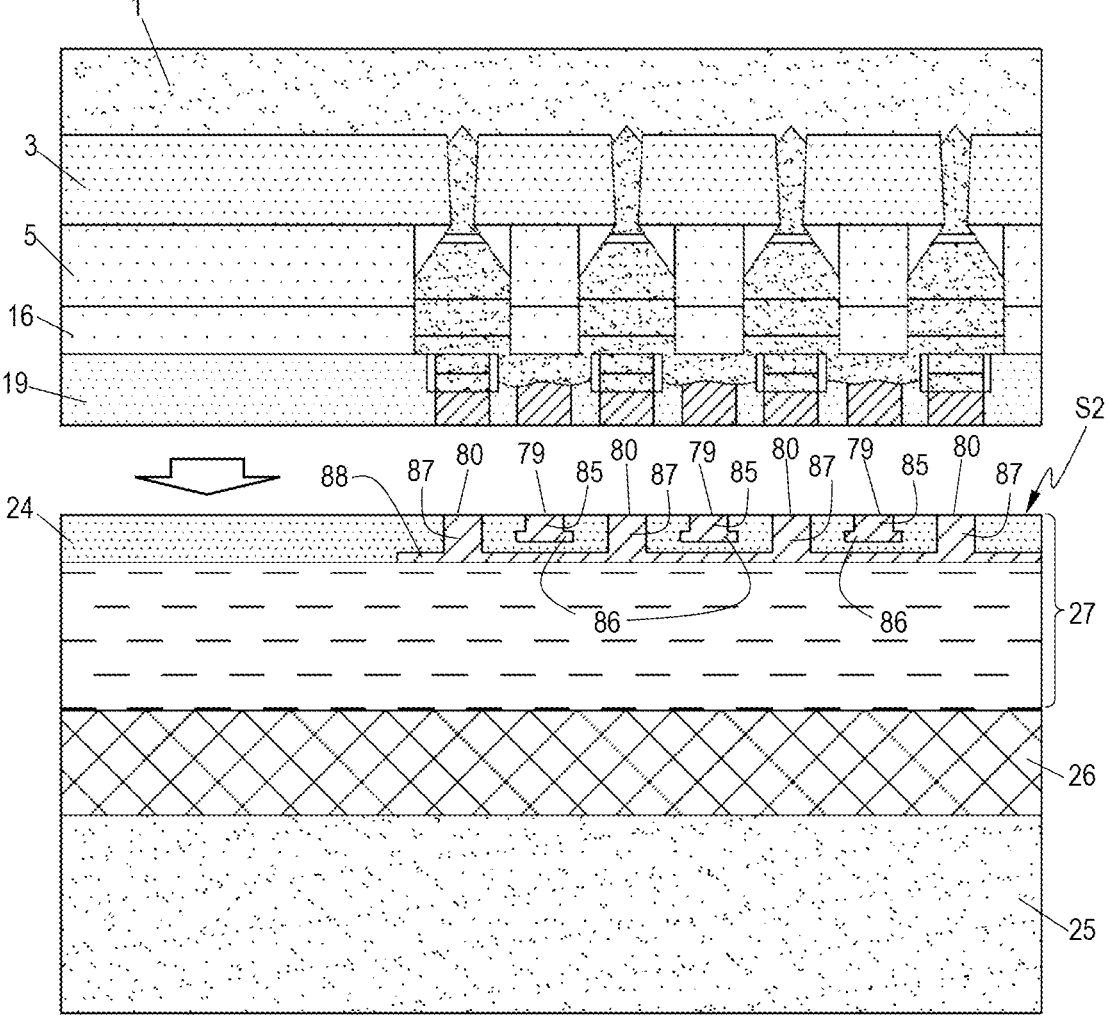

With reference to FIG. 5g, the donor wafer 1 is flipped and bonded to the carrier wafer 25 in the same way as described above, the carrier wafer 25 being again provided with a FEOL layer 26 and a BEOL layer 27. The BEOL layer comprises a top dielectric layer 24 having a dielectric bonding surface S2 with contact pads 79 and 80 for respectively contacting the base and the emitter. The pads 79 and 80 are coplanar with the bonding surface S2 and arranged at mutual distances corresponding to the base-coupled contact pads 76 and the emitter-coupled contact pads 75 on the donor wafer. In the upper region of the BEOL layer 27, the base contact pads 79 are coupled to contact vias 85 connected to transversal interconnect lines 86, while the emitter contact pads 79 are coupled to contact vias 87 connected to a contact line 88 parallel to the plane of the drawing. The transversal interconnect lines 86 are interconnected by a connection outside the plane of the image, to thereby interconnect the plurality of contacts to the base of the HEMT.

Figures 5H, 5I:
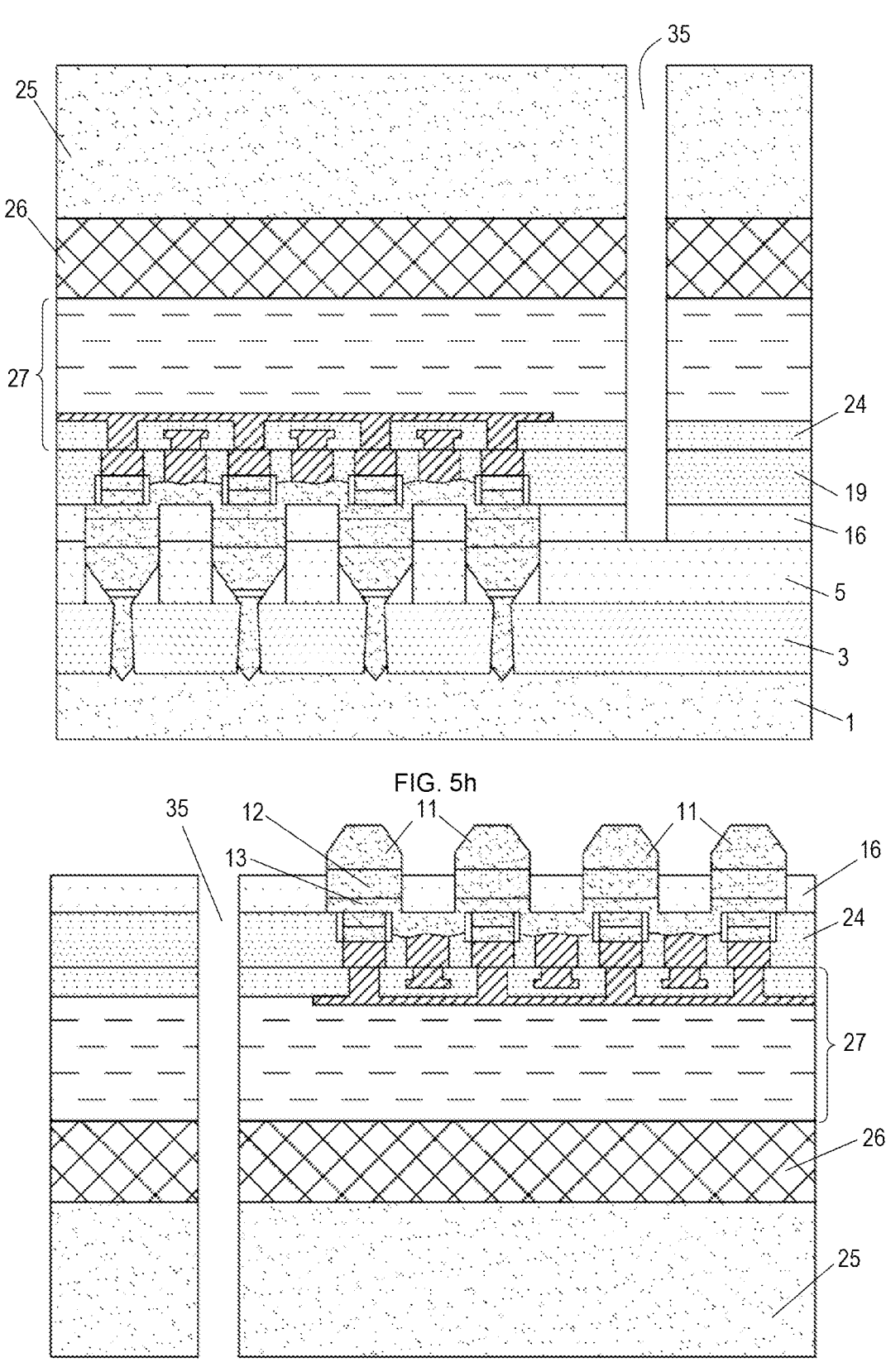

After the bonding step, TSV openings are produced from the back of the carrier wafer 25, as illustrated in FIG. 5h, showing one TSV opening 35 that is etched by anisotropic etching, stopping on the interface between the first and second sublayers 5 and 16 of the template layer.

In the same way as described above, the first sublayer 5 and the release layer 10 are then selectively removed, wherein at least one of these two layers is removed by supplying an etchant through the TSV openings 35, to thereby release the carrier wafer 25 from the donor wafer 1. With reference to FIG. 5i, the carrier wafer is flipped and placed on a support surface (not shown), with the collector contact layers 11 of the four III-V stacks directed upwards.

Figure 5J:
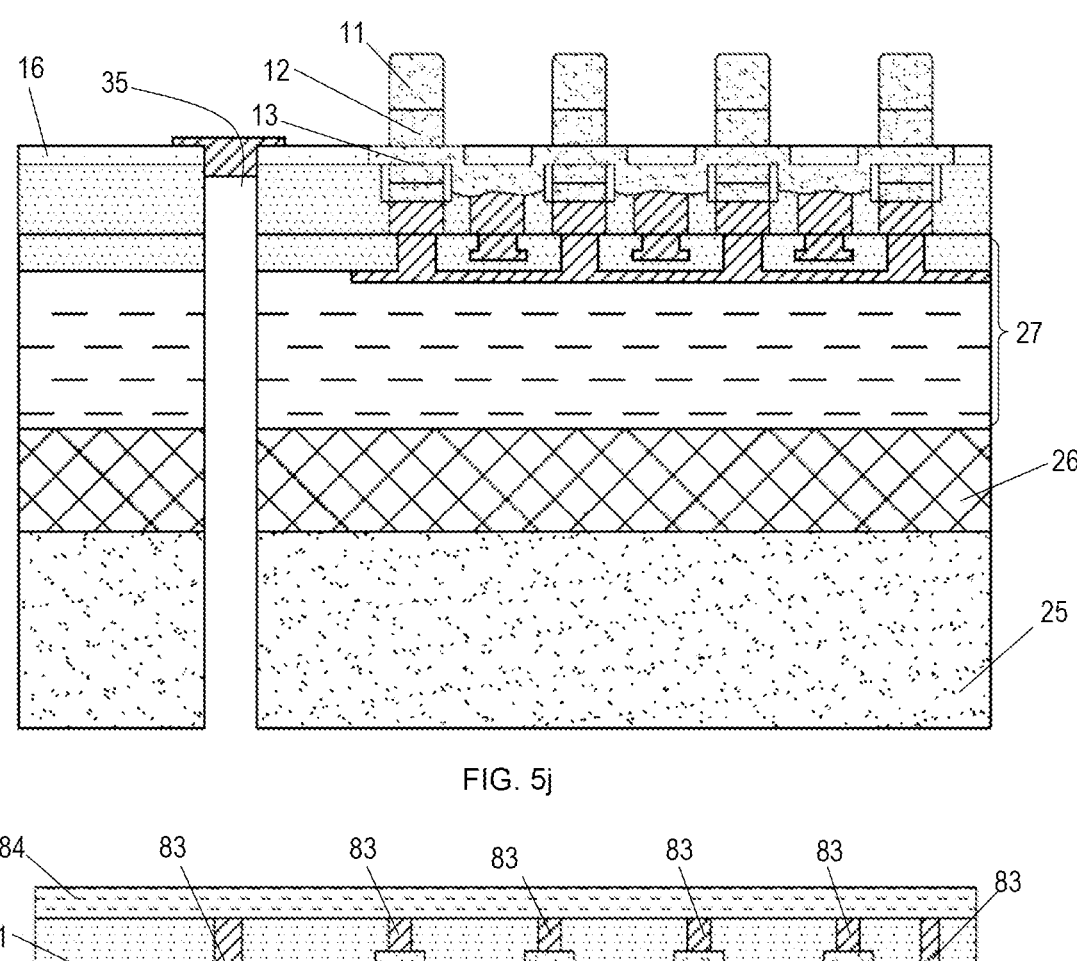
Figure 5K:
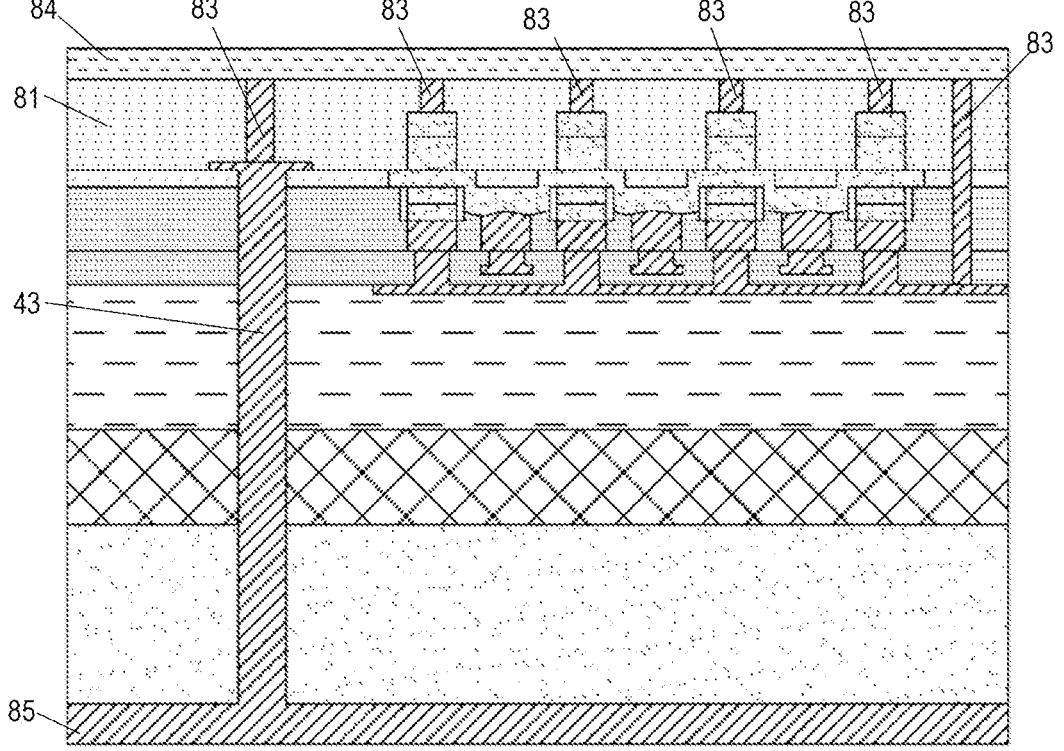

A patterning step is then performed as illustrated in FIG. 5j, whereby the collector layers 12 and the collector contact layers 11 are partially etched back relative to a central portion of the layers and wherein also the dielectric layer 16 is etched back to the level of the base layers 13. With reference to FIGS. 5j and 5k, this is then followed by further processing the HBT in the sense of producing the contact pad 80', the dielectric layer 81, the contact vias 83, the redistribution layer 84, the metal-filled vias 43 and the backside ground layer 85, connected to the FIBT in the same way as described above with reference to FIG. 1p.

The resulting FIBT device comprises the common base obtained by the growth of the III-V material from the original base layers 13, the collector formed of the four interconnected collector layers 12 and the emitter formed of the four interconnected emitter layers 14. This approach has a number of advantages compared to the design according to FIGS. 1a to 1m, wherein an HBT device is built on a single nano-ridge structure. In the latter case, there is a trade-off between the size of the base contacts and the base-collector extrinsic capacitance (larger contact size is beneficial for device performance but also leads to higher parasitic capacitance). In the approach shown in FIGS. 5a to 5m, this trade-off is eliminated, and the base contact size can be optimized without a detrimental effect on the extrinsic capacitance. In addition, the base contacts can be placed further away from the emitter contacts, to thereby reduce the metal line parasitic capacitance.

Reference is now made to FIGS. 6a to 6h, which illustrate an embodiment of the present disclosure that is not limited to the production of nano-ridge structures but that exploits the possibility of epitaxially growing semiconductor material on a donor wafer, wherein the grown material exhibits essentially no large mismatch in terms of the lattice constant and the thermal expansion coefficient with respect to the donor wafer material. This possibility is available for a number of material combinations, for example for a germanium donor wafer and the growth thereon of a GaAs layer. Other layers which may be grown without a large mismatch on Ge include (among others): AlAs, AlGaAs, InGaP, InGaAsP, InGaAs, InGaAsP. On the GaAs layer, additional layers may then be grown which are all matched to the underlying layer or thinner than the critical thickness, so that a multilayer structure of essentially defect free layers is obtained. As there is only a very small mismatch at the basis of the stack, it is not necessary to apply aspect ratio trapping, and the area coverage of the stack can be higher compared to a nano-ridge structure. The main characteristic features of the present disclosure are however retained in these embodiments, in particular the 2-part template layer 5+16, the release layer 10 and the TSVs 35, as well as the bonding and release steps.

Figure 6A:
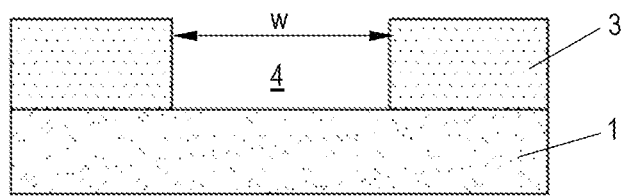

Reference is first made to FIG. 6a, which shows a Ge donor wafer 1 with a patterned support layer 3 on its surface. Layer 3 can be a dielectric layer. It can be a photoresist layer or any other type of mask layer. The layer 3 is patterned so that at least one cavity 4 is formed. The cavity may be square or rectangular shaped having a width w. The width w could for example be in a range between 0.5 μm and several hundred micrometres.

Figure 6B:
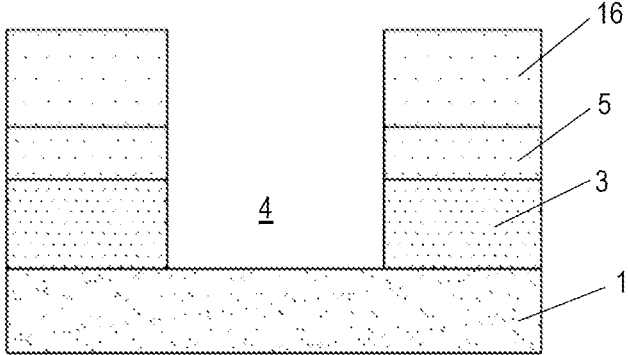

With reference to FIG. 6b, the dielectric layers 5 and 16 of the template layer are subsequently deposited and patterned so that a gap is formed in these layers 5 and 16 that is aligned with the trench 4, as shown in the drawing. The gap could also be slightly wider and fully overlapping the width w of the trench 4. Alternatively, layers 3, 5 and 16 are first formed by a blanket deposition on the donor wafer 1, and the trench 4 is formed by consecutively etching through the three layers. As in the previous embodiments, the first sublayer 5 is selectively removable relative to the second sublayer 16.

Figure 6C:
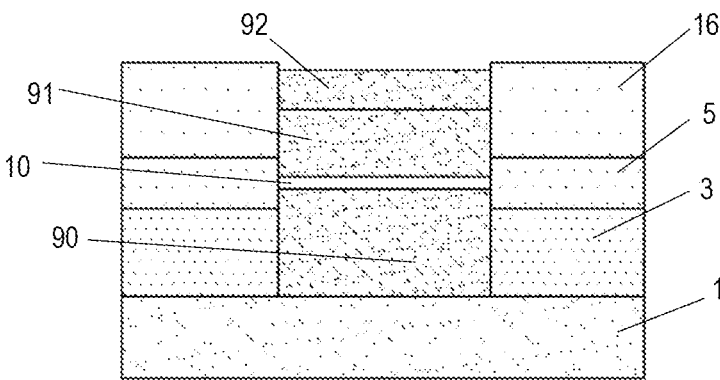

On the bottom of the trench 4, see FIG. 6c, a layer 90 of GaAs is grown by a process that is known as such in the art under the name Selective Area Growth (SAG). It is a growth process wherein GaAs is deposited selectively on a particular material, in this case Ge, and not on other materials, in this case the material of the support layer 3. In the embodiment shown, the GaAs layer 90 continues to grow until it extends above the upper surface of the support layer 3. Then the release layer 10 is grown on top of the GaAs layer 90, and further III-V compound layers 91 and 92 are consecutively grown after that, resulting in a multilayer structure 90-10-91-92 of III-V materials that is essentially defect-free. The material of the release layer 10 is again chosen so that this layer is selectively removable relative to the other layers of the structure, and its material and/or thickness is such that no large lattice mismatch is created between the first grown layer 90 and the upper layers 91 and 92, preventing any significant defect formation. By way of example, layers 91 and 92 are respectively p-doped and n-doped GaAs layers, and the device that is to be produced from these layers is a p-n diode. This is however a mere example and the formation of other types of devices, such as lasers or sensors of various types and configurations can be enabled by depositing additional III-V layers.

The sidewalls of layers 5 and 16 contain any growth of the layers in the lateral direction when the structure grows above the edges of the cavity 4, so that the structure grows only in the upward direction. Depending on the materials chosen, it may be possible also to grow the structure in the upward direction without retaining the structure from the sides. In that case, the sublayers 5 and 16 of the template layer may be deposited after growing the multilayer structure.

Figure 6D:
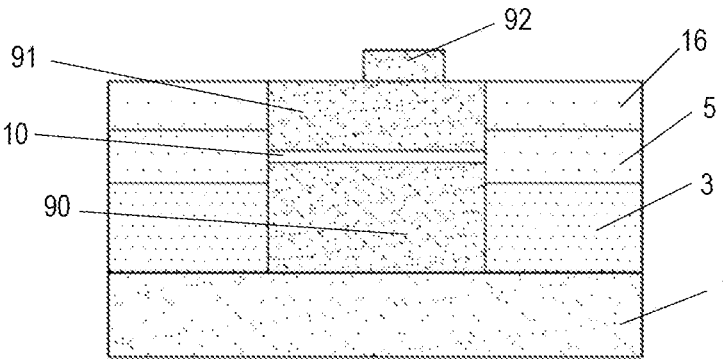
Figure 6E:
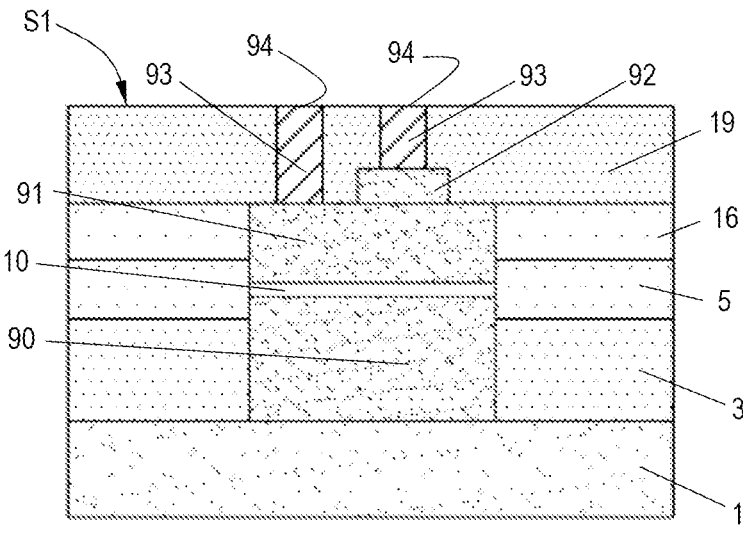
Figure 6F:
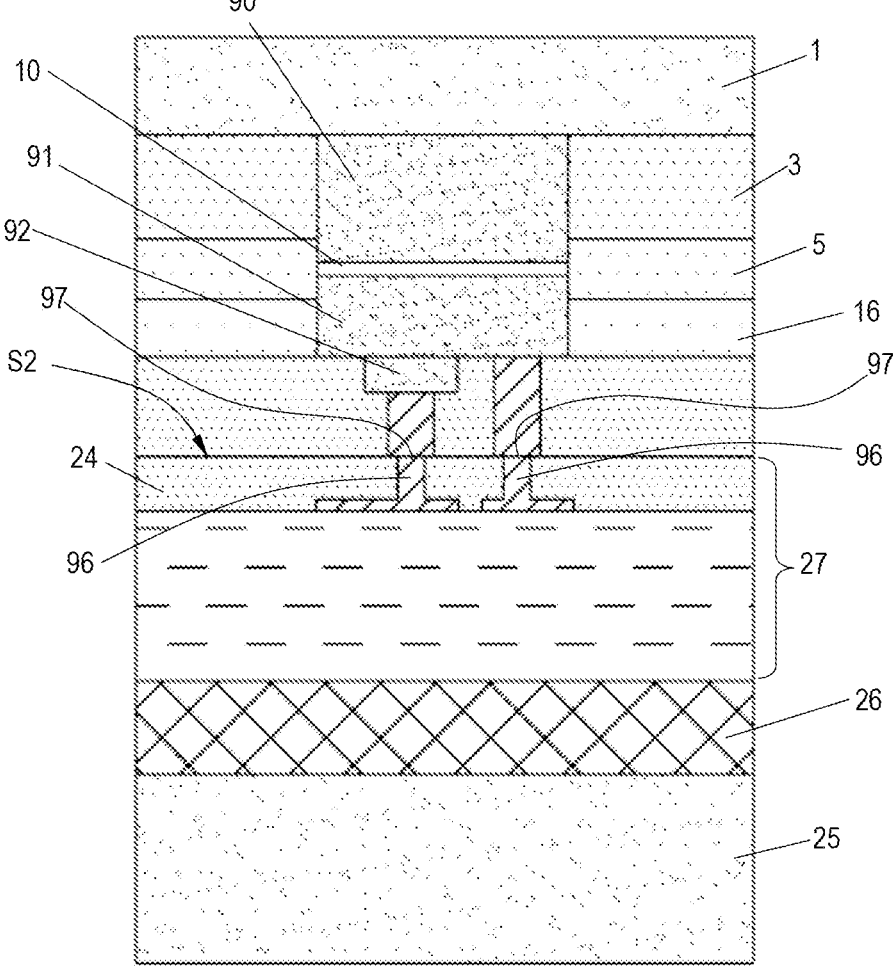
Figure 6G:
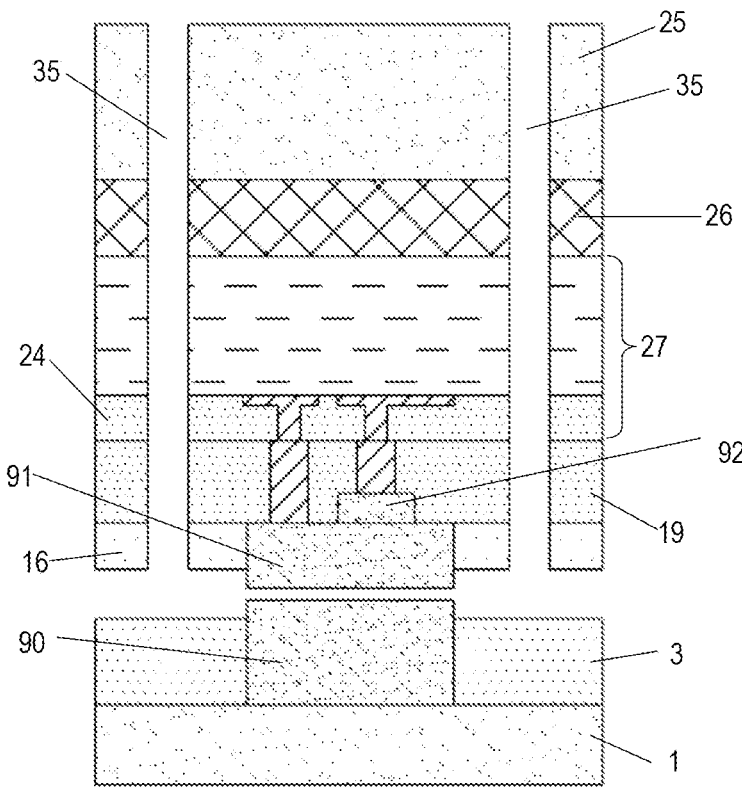

With reference to FIG. 6*d*, the upper sublayer 16 is etched back and the upper GaAs layer 92 of the structure is patterned relative to the underlying layer 91. Conductive paths 93 and contact pads 94 are then formed, embedded in a dielectric layer 19, as shown in FIG. 6*e*, and the upper surface is planarized to form a hybrid bonding surface S1. The carrier wafer 25 is provided (see FIG. 6*f*), having the same sub-parts as described above, the FEOL portion 26 and BEOL portion 27, the latter comprising a top dielectric layer 24 having contact vias 96 and contact pads 97 coplanar with a second hybrid bonding surface S2. FIG. 6*f* shows the result of the bonding process. With reference to FIG. 6*g*, TSV openings 35 are again produced from the back side of the (in some examples, thinned) carrier wafer 25 and the donor wafer 1 is released by selectively removing the first sublayer 5 of the template layer and the release layer 10.

Figure 6H:
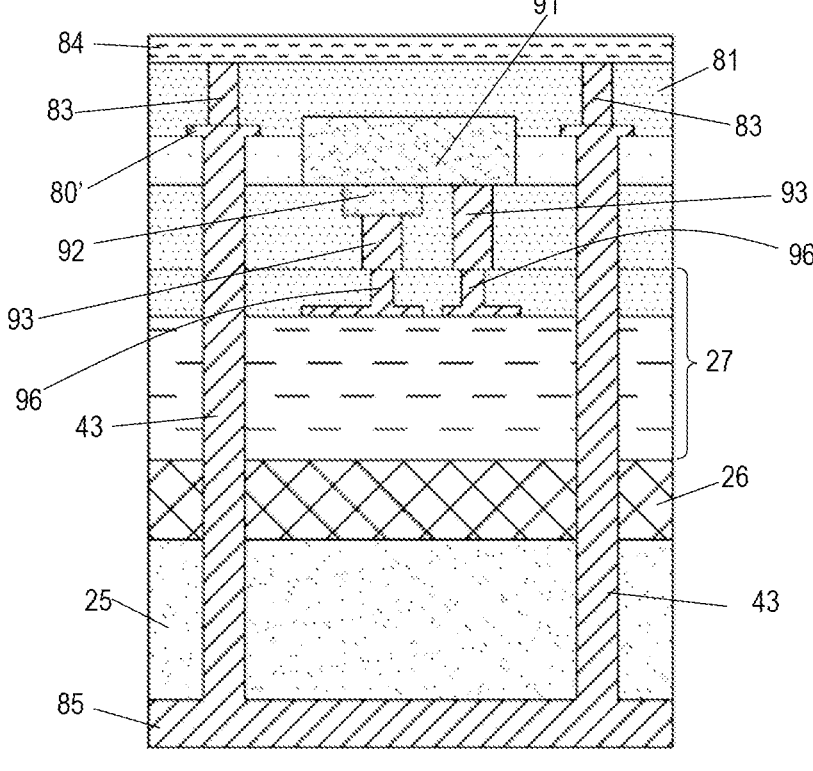

Further processing may result in the image shown in FIG. 6*h*, comprising TSVs 43, the upper redistribution layer 84 and the lower ground layer 85, the via interconnects 83 and the dielectric layer 81 obtained in analogy with the embodiments described earlier. The p-n diode junction between layers 91 and 92 is connected through the bonded paths 93 and 96 to the BEOL portion 27. Alternatively, only layer 92 could be connected to the BEOL portion 27 through bonded paths 93 and 96 while layer 91 is contacted from the opposite side by an interconnect via embedded in layer 81.

According to another embodiment, the layer that is grown by SAG on the Ge surface at the bottom of the trench 4 in FIG. 6*a* is also a Ge layer. The release layer 10 is again a III-V layer that is lattice-matched to the Ge layer and/or sufficiently thin, and on top of the release layer 10, one or more group IV layers are grown. This may be another Ge layer, a layer of SiGe or a multilayer of different group IV materials, to be further processed for forming specific devices for which these materials are suitable. The bonding and release steps are performed in the same way as set out above for any of the described embodiments.

While the present disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed present disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method for producing a semiconductor chip comprising the steps of:

providing a first semiconductor substrate including a support layer arranged thereon, the support layer comprising at least one cavity that is open through a surface of the support layer, with a semiconductor material of the first semiconductor substrate exposed on a bottom of the cavity;

producing a multilayer structure on the first semiconductor substrate and extending outward from the surface of the support layer, by growing consecutive layers in the at least one cavity and subsequently out of the at least one cavity, the multilayer structure comprising:

at least one first semiconductor layer grown upwards from the bottom of the cavity;

a release layer, on the at least one first semiconductor layer;

one or more additional semiconductor layers on the release layer, wherein at least the one or more additional semiconductor layers above the release layer are essentially defect-free layers;

producing a dielectric template layer on the support layer, wherein:

the dielectric template layer comprises a first sublayer directly on the support layer, the first sublayer being formed of a first dielectric material, and a second sublayer directly on the first sublayer, and formed of a second dielectric material different from the first dielectric material;

the first sublayer and the second sublayer are formed before or after producing the multilayer structure;

the dielectric template layer is directly adjacent and in contact with the multilayer structure, leaving a top layer of the multilayer structure exposed;

the first dielectric material is etchable selectively with respect to the second dielectric material, the multilayer structure and the support layer;

at least one of the bottom and top surface of the release layer is positioned between the bottom and top surface of the first sublayer of the dielectric template layer;

after the formation of the multilayer structure and the dielectric template layer, producing at least one semiconductor device from one or more additional semiconductor layers positioned above the release layer;

after producing the at least one semiconductor device, producing electrically conductive paths and a plurality of first contact pads, so that the conductive paths couple the at least one semiconductor device to the first contact pads, the first contact pads being part of a planar hybrid bonding surface formed of the first contact pads and of a first dielectric bonding layer produced on the second sublayer of the dielectric template layer;

providing a second semiconductor substrate, comprising a front end of line portion comprising further semiconductor devices, and a back end of line portion, the back end of line portion comprising a plurality of second contact pads, the plurality of second contact pads being part of a second planar hybrid bonding surface formed of the plurality of second contact pads and of a second dielectric bonding layer that is part of the back end of line portion;

performing hybrid bonding of the first semiconductor substrate to the second semiconductor substrate by mutually bonding the first dielectric and second dielectric bonding surfaces, so that the plurality of first contact pads are bonded and electrically connected to the plurality of second contact pads, thereby forming a bonded wafer assembly;

after the hybrid bonding process, producing a plurality of through semiconductor via openings through the second semiconductor substrate, starting from the back of the semiconductor second substrate and traversing the full thickness of the second sublayer of the dielectric template layer;

after producing the TSV openings, removing the first sublayer of the dielectric template layer selectively with respect to the second sublayer and with respect to the support layer and the multilayer structure, by supplying an etchant that removes the first sublayer selectively with respect to the multilayer structure and with respect to the second sublayer;

after removing the first sublayer, removing the release layer by supplying an etchant that removes the release layer selectively with respect to the other layers of the multilayer structure and with respect to the second sublayer and the support layer, thereby releasing the semiconductor second substrate and the device from the first semiconductor substrate, leaving a backside of the device exposed, wherein at least one of the etchants is supplied through the TSV openings;

after releasing the second semiconductor substrate, filling the TSV openings with an electrically conductive material; and singulating the second semiconductor substrate to thereby obtain a semiconductor chip comprising the device formed of layers of the multilayer structure, integrated with the devices in the front end of line portion.

2. The method of claim 1, wherein the cavity is a trench and wherein the multilayer structure is a nano-ridge structure obtained by growing a first layer in the trench, the width of the trench being suitable for applying aspect ratio trapping.

3. The method of claim 2, wherein the first semiconductor substrate is a silicon or a germanium substrate and wherein the nano-ridge structure is formed of layers of group III-V semiconductor material.

4. The method of claim 1, wherein the first layer grown directly on the bottom of the cavity is essentially matching the first semiconductor substrate in terms of the respective lattice constants and thermal expansion coefficients of the first layer and of the first substrate.

5. The method of claim 4, wherein the first semiconductor substrate is a germanium substrate, and wherein the multilayer structure is formed of layers of group III-V semiconductor material, or wherein the multilayer structure comprises a Ge layer directly on the Ge substrate, a group III-V release layer and one or more group IV semiconductor layers on the release layer.

6. The method of claim 5, wherein at least the first sublayer of the dielectric template layer is produced prior to growing the multilayer structure, and patterned so as to form sidewalls aligned to at least two opposite edges of the cavity so that the growth of the multilayer structure outside of the cavity is laterally contained by the sidewalls.

7. The method of claim 1, wherein at least the first sublayer of the dielectric template layer is produced prior to growing the multilayer structure, and patterned so as to form sidewalls aligned to at least two opposite edges of the cavity so that the growth of the multilayer structure outside of the cavity is laterally contained by the sidewalls.

8. The method of claim 3, wherein at least the first layer of the template layer is produced prior to growing the multilayer structure, and patterned so as to form sidewalls aligned to at least two opposite edges of the cavity so that the growth of the multilayer structure outside of the cavity is laterally contained by the sidewalls.

9. The method of claim 1, wherein the dielectric template layer is produced after the formation of the multilayer structure, by producing the first sublayer on the support layer after the structure has been produced, and by producing the second sublayer on the first sublayer.

10. The method of claim 5, wherein the dielectric template layer is produced after the formation of the multilayer structure, by producing the first sublayer on the support layer after the structure has been produced, and by producing the second sublayer on the first sublayer.

11. The method of claim 1, wherein the at least one semiconductor device is a heterojunction bipolar transistor (HBT) formed on at least one multilayer structure, and comprising a collector layer, a base layer and an emitter layer.

12. The method according to claim 11, wherein an HBT is formed on an array of directly adjacent and parallel multilayer structures comprising the same layer sequence, and wherein the method comprises the steps of:

exposing a portion of the base layers of the array of multilayer structures, by removing portions of the layers present on top of the base layers;

epitaxially growing the material of the base layers on the exposed portions of the base layers, until the material merges in the areas between the nano-ridge structures, thereby forming base contact portions at least in between the nano-ridge structures;

producing conductive paths which are electrically connected to the base contact portions and to contact pads which are coplanar with the first bonding surface;

for each structure of the array of multilayer structures, producing a conductive path that is electrically connected to the remaining portion of the layers present on top of the base layer and to a contact pad that is coplanar with the first bonding surface;

bonding the contact pads to respective contact pads which are coplanar with the second bonding surface.

13. The method of claim 1, wherein the at least one semiconductor device is a high electron mobility transistor (HEMT) formed on one multilayer structure and comprising a channel layer and at least one barrier layer.

14. The method of claim 1, further comprising, after releasing and before singulating the second semiconductor substrate, the step of producing electrical connections to one or more layers of the released device, possibly after thinning and/or patterning the one or more layers.

15. The method of claim 5, further comprising, after releasing and before singulating the second semiconductor substrate, the step of producing electrical connections to one or more layers of the released device, possibly after thinning and/or patterning the one or more layers.

16. A semiconductor chip produced according to the method of claim 1, the semiconductor chip further comprising:

a carrier substrate corresponding to the first semiconductor substrate;

a front end of line (FEOL) portion above the carrier substrate;

a back end of line portion above the FEOL portion and comprising a top layer comprising the first contact pads;

wherein the second contact pads are bonded and thereby electrically connected to the first contact pads;

conductive paths connected to the second contact pads;

wherein the second semiconductor device is located above the back end of line portion and coupled to the conductive paths.

17. The chip of claim 16, wherein the semiconductor device is a group III-V device or a group IV device and wherein the carrier substrate is a silicon substrate.

18. The chip of claim 17 wherein the semiconductor device is a HBT or a HEMT.

19. The chip of claim 16 wherein the semiconductor device is a HBT or a HEMT.

20. The chip of claim 19 comprising multiple of the devices, including at least one HBT and at least one HEMT.

* * * * *